US011189735B2

United States Patent
Hayashi et al.

(10) Patent No.: US 11,189,735 B2
(45) Date of Patent: Nov. 30, 2021

(54) SEMICONDUCTOR DEVICE AND DISPLAY APPARATUS

(71) Applicant: JOLED INC., Tokyo (JP)

(72) Inventors: Hiroshi Hayashi, Tokyo (JP); Naoki Asano, Tokyo (JP); Ryo Koshiishi, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/736,813

(22) Filed: Jan. 8, 2020

(65) Prior Publication Data

US 2020/0321469 A1 Oct. 8, 2020

(30) Foreign Application Priority Data

Apr. 8, 2019 (JP) .............................. JP2019-073390

(51) Int. Cl.
*H01L 21/00* (2006.01)
*H01L 27/00* (2006.01)
*H01L 29/00* (2006.01)
*H01L 29/786* (2006.01)
*H01L 27/12* (2006.01)
(Continued)

(52) U.S. Cl.
CPC ...... *H01L 29/7869* (2013.01); *H01L 21/0217* (2013.01); *H01L 21/02164* (2013.01); *H01L 21/02178* (2013.01); *H01L 27/1225* (2013.01); *H01L 27/1248* (2013.01); *H01L 27/1255* (2013.01); *H01L 29/12* (2013.01); *H01L 29/78606* (2013.01); *H01L 29/78696* (2013.01)

(58) Field of Classification Search
CPC ........... H01L 21/0217; H01L 21/02178; H01L 21/02164; H01L 27/1255; H01L 27/1225; H01L 27/1248; H01L 29/7869; H01L 29/66969; H01L 29/12; H01L 29/78696; H01L 29/78621; H01L 29/78606
See application file for complete search history.

(56) References Cited

U.S. PATENT DOCUMENTS 8,835,918 B2 * 9/2014 Yamazaki ........... H01L 29/7869
257/43
8,890,781 B2 * 11/2014 Yamazaki ......... H01L 29/78693
345/82
9,240,488 B2 * 1/2016 Yamazaki ........... H01L 29/7869
(Continued)

FOREIGN PATENT DOCUMENTS

JP 2015-108731 A 6/2015

OTHER PUBLICATIONS

Kevane, "Oxygen Vacancies and Electrical Conduction in Metal Oxides", 1964, Physical Review, vol. 133, No. 5A, pp. A1431-A1436; Mar. 2, 1964 (Year: 1994).*

*Primary Examiner* — Nikolay K Yushin
(74) *Attorney, Agent, or Firm* — Hauptman Ham, LLP

(57) ABSTRACT

A semiconductor device includes a gate electrode, a semiconductor film, and a conductive film. The semiconductor film includes an oxide semiconductor material. The semiconductor film includes a channel region, a low-resistance region, and an intermediate region. The channel region is opposed to the gate electrode. The low-resistance region has a lower electric resistance than the channel region. The intermediate region is provided between the low-resistance region and the channel region. The conductive film is provided selectively in contact with the low-resistance region of the semiconductor film.

19 Claims, 22 Drawing Sheets

(51) Int. Cl.
*H01L 21/02* (2006.01)
*H01L 29/12* (2006.01)

(56) References Cited

U.S. PATENT DOCUMENTS

| | | | |
|---|---|---|---|
| 9,859,437 B2 * | 1/2018 | Morosawa | H01L 29/41733 |
| 2010/0295042 A1 * | 11/2010 | Yano | H01L 29/7869 |
| | | | 257/43 |
| 2011/0090207 A1 * | 4/2011 | Yamazaki | G09G 3/3233 |
| | | | 345/211 |
| 2011/0147738 A1 * | 6/2011 | Yamazaki | H01L 29/24 |
| | | | 257/43 |
| 2011/0240998 A1 * | 10/2011 | Morosawa | H01L 29/7869 |
| | | | 257/57 |
| 2013/0069053 A1 * | 3/2013 | Yamazaki | H01L 27/1225 |
| | | | 257/43 |
| 2015/0162399 A1 | 6/2015 | Sato | |

* cited by examiner

SEMICONDUCTOR DEVICE AND DISPLAY APPARATUS

CROSS-REFERENCE TO RELATED APPLICATIONS

The present application claims priority from Japanese Patent Application No. 2019-073390 filed on Apr. 8, 2019, the entire contents of which are hereby incorporated by reference.

BACKGROUND

The technology relates to a semiconductor device that includes an oxide semiconductor material and to a display apparatus.

A thin film transistor (TFT) is used to drive a display apparatus, for example. In recent years, a thin film transistor that includes an oxide semiconductor material is being developed actively, as disclosed in Japanese Unexamined Patent Application Publication No. 2015-108731, for example.

SUMMARY

A semiconductor device according to one embodiment of the technology includes a gate electrode, a semiconductor film, and a conductive film. The semiconductor film includes an oxide semiconductor material. The semiconductor film includes a channel region opposed to the gate electrode, a low-resistance region having a lower electric resistance than the channel region, and an intermediate region between the low-resistance region and the channel region. The conductive film is provided selectively in contact with the low-resistance region of the semiconductor film.

A semiconductor device according to one embodiment of the technology includes a gate electrode, a semiconductor film, and a conductive auxiliary film. The semiconductor film includes an oxide semiconductor material. The semiconductor film includes a channel region opposed to the gate electrode, a low-resistance region having a lower electric resistance than the channel region, and an intermediate region provided between the low-resistance region and the channel region and having a carrier concentration satisfying the following Expression 1:

$$C1 < C2 < C3 \qquad \text{Expression 1}$$

where

C1 denotes the carrier concentration in the channel region of the semiconductor film, C2 denotes the carrier concentration in the intermediate region of the semiconductor film, and C3 denotes the carrier concentration in the low-resistance region of the semiconductor film. The conductive auxiliary film is provided selectively in contact with the low-resistance region of the semiconductor film. The conductive auxiliary film reduces a resistance of the semiconductor film.

A display apparatus according to one embodiment of the technology includes a display element and a semiconductor device that drives the display element. The semiconductor device includes a gate electrode, a semiconductor film, and a conductive auxiliary film. The semiconductor film includes an oxide semiconductor material. The semiconductor film includes a channel region opposed to the gate electrode, a low-resistance region having a lower electric resistance than the channel region, and an intermediate region provided between the low-resistance region and the channel region and having a carrier concentration satisfying the following Expression 1:

$$C1 < C2 < C3 \qquad \text{Expression 1}$$

where

C1 denotes the carrier concentration in the channel region of the semiconductor film, C2 denotes the carrier concentration in the intermediate region of the semiconductor film, and C3 denotes the carrier concentration in the low-resistance region of the semiconductor film. The conductive auxiliary film is provided selectively in contact with the low-resistance region of the semiconductor film. The conductive auxiliary film reduces a resistance of the semiconductor film.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

FIG. 21 is a schematic diagram illustrating another example (1) of a cross-sectional configuration of the semiconductor device illustrated in FIG. 1 and so on.

FIG. 22 is a schematic diagram illustrating yet another example (2) of a cross-sectional configuration of the semiconductor device illustrated in FIG. 1 and so on.

DETAILED DESCRIPTION

Figure 1:
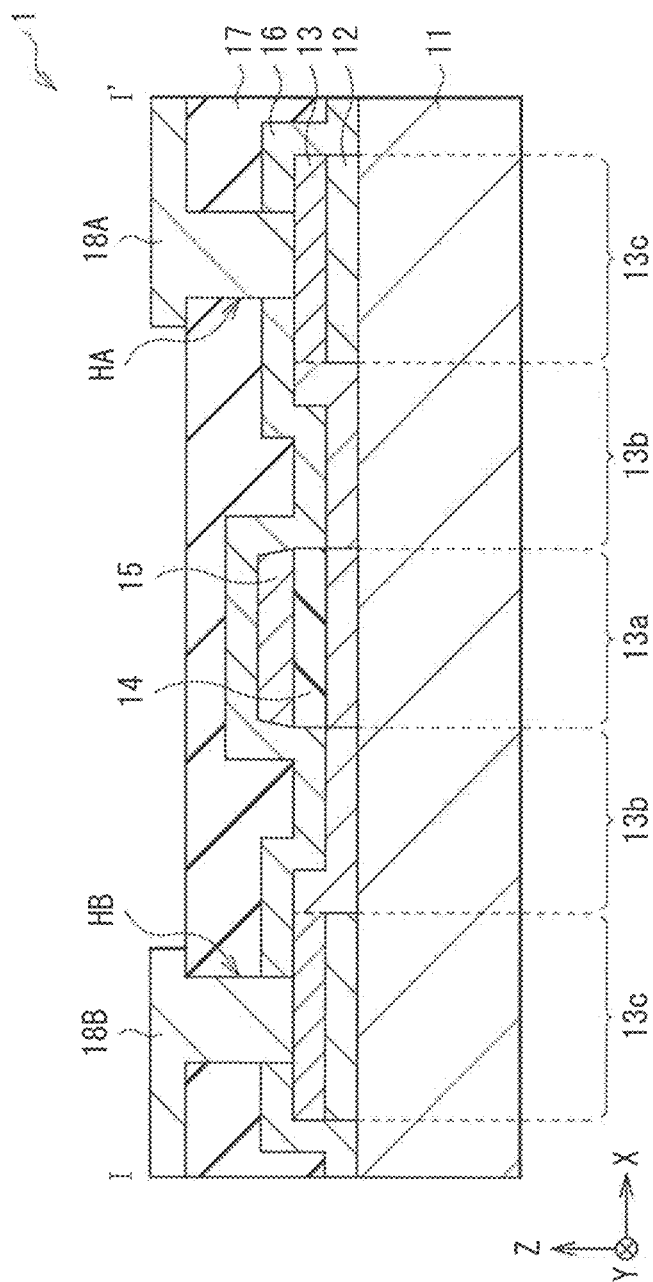
FIG. 1 is a cross-sectional schematic diagram illustrating an example of a configuration of a main portion of a semiconductor device according to one example embodiment of the technology.

In a semiconductor device that includes a thin film transistor, it is desired to suppress a variation in characteristics, such as a threshold voltage Vth, associated with a channel length, for example.

It is desirable to provide a semiconductor device that is able to suppress a variation in the characteristics and to provide a display apparatus that includes such a semiconductor device.

Hereinafter, some example embodiments of the technology will be described in detail with reference to the drawings. Note that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. Note that the like elements are denoted with the same reference numerals, and any redundant description thereof will not be described in detail. The description will be given in the following order.

1. First Example Embodiment (an example of a semiconductor device including a conductive film that is in contact with a semiconductor film)
2. Second Example Embodiment (an example of a semiconductor device including a conductive auxiliary film that is in contact with a semiconductor film)

3. Modification Example 1 (an example in which a conductive film or a conductive auxiliary film is in contact with an upper surface of a semiconductor film)
4. Modification Example 2 (an example in which a semiconductor device includes a thin film transistor of a bottom gate type)
5. Application Example 1 (an example of a display apparatus and an example of an imaging apparatus)
6. Application Example 2 (an example of electronic equipment)

1. First Example Embodiment

Figure 2:
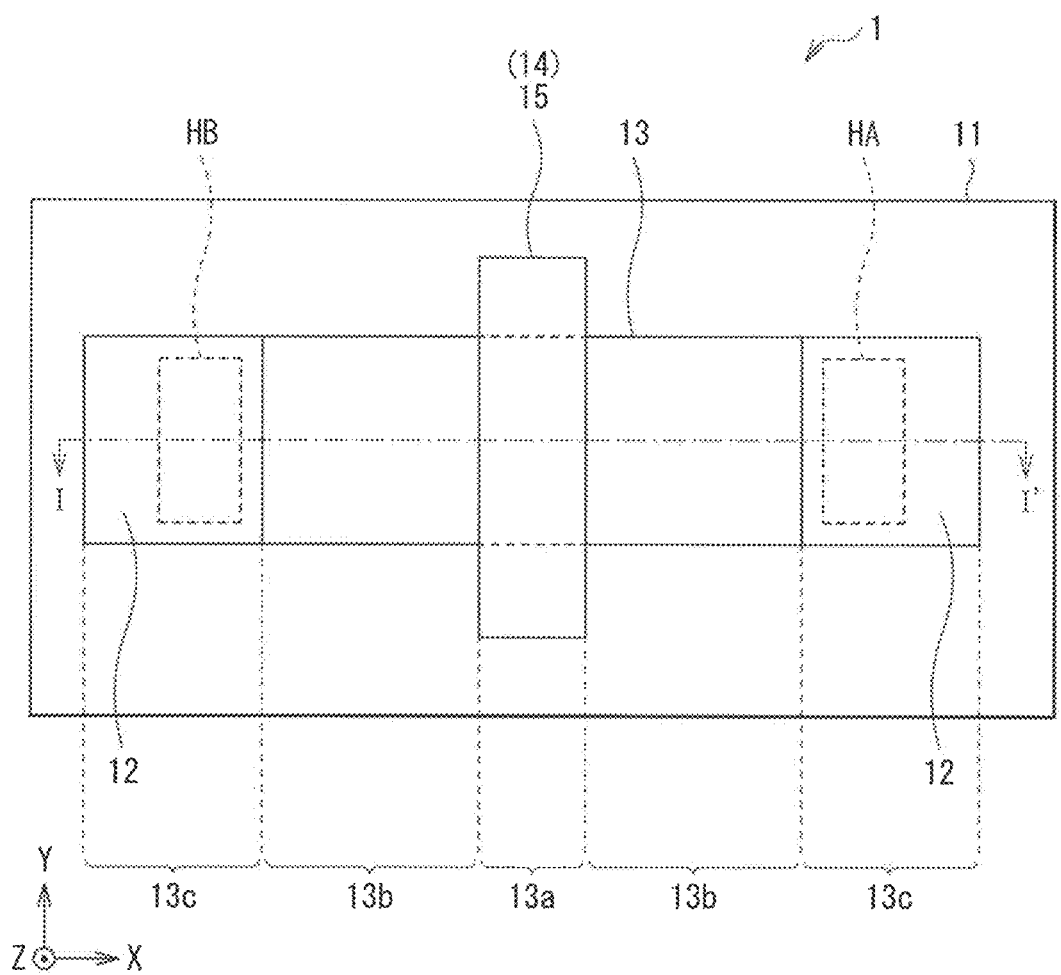
FIG. 2 is a schematic diagram illustrating an example of a planar configuration of the semiconductor device illustrated in FIG. 1.

[Configuration]
FIGS. 1 and 2 schematically illustrate an example of a configuration of a main portion of a semiconductor device, i.e., a semiconductor device 1, according to a first example embodiment of the technology. FIG. 1 illustrates a cross-sectional configuration of a main portion of the semiconductor device 1, and FIG. 2 illustrates a planar configuration of the semiconductor device 1 corresponding to FIG. 1. FIG. 1 corresponds to a cross-sectional configuration along the I-I' line indicated in FIG. 2. The semiconductor device 1 may be used in a driving circuit of, for example but not limited to, a display apparatus or an imaging apparatus, for example. The semiconductor device 1 may be used in a driving circuit of a display apparatus 2A illustrated in FIG. 18 or an imaging apparatus 2B illustrated in FIG. 19, which will be described later. In the semiconductor device 1, a conductive film 12, a semiconductor film 13, a gate insulating film 14, a gate electrode 15, a metal oxide film 16, an interlayer insulating film 17, and a pair of source-drain electrodes 18A and 18B may be stacked in this order over a substrate 11. In other words, the semiconductor device 1 may include a thin film transistor of a top gate type.

The semiconductor film 13 may include a channel region 13a of the thin film transistor. The channel region 13a may be opposed to the gate electrode 15. The semiconductor film 13 may further include low-resistance regions 13c having a lower electric resistance than the channel region 13a. The low-resistance regions 13c may be coupled to the source-drain electrodes 18A and 18B. The semiconductor film 13 may further include intermediate regions 13b. The intermediate regions 13b may be provided between the channel region 13a and the respective low-resistance regions 13c.

The interlayer insulating film 17 and the metal oxide film 16 may each have a pair of through-holes HA and HB. The source-drain electrodes 18A and 18B may be coupled to the semiconductor film 13 via the respective through-holes HA and HB. In a more specific but non-limiting example, the source-drain electrodes 18A and 18B may be coupled to the low-resistance regions 13c via the respective through-holes HA and HB. Each portion of the semiconductor device 1 will be described below.

The substrate 11 may be formed of, for example but not limited to, glass, quartz, or silicon. Alternatively, the substrate 11 may be formed of a resin material, such as polyethylene terephthalate (PET), polyimide (PI), polycarbonate (PC), or polyethylene naphthalate (PEN), for example. Aside from the above, an insulating material may be deposited on a metal plate of, for example but not limited to, stainless steel (SUS), and this may serve as the substrate 11.

The conductive film 12 may be provided between the substrate 11 and the semiconductor film 13, and the conductive film 12 may be provided in a selective region on the substrate 11. In a specific but non-limiting example, the conductive film 12 may be provided in regions overlapping the low-resistance regions 13c of the semiconductor film 13 as viewed in a plan view, i.e., a plan view along an XY-plane in FIG. 2, and the conductive film 12 may be in contact with a lower surface of the semiconductor film 13, i.e., a surface facing the substrate 11. The conductive film 12 may not be provided in a region overlapping the channel region 13a and regions overlapping the intermediate regions 13b of the semiconductor film 13 as viewed in a plan view. In other words, out of the channel region 13a and the low-resistance regions 13c of the semiconductor film 13, the conductive film 12 may be disposed selectively in portions opposed to the low-resistance regions 13c.

The presence of such a conductive film 12 may allow the low-resistance regions 13c of the semiconductor film 13 to serve as a wire even when the carrier concentration in the low-resistance regions 13c of the semiconductor film 13 has decreased.

The conductive film 12 may be selectively in contact with the low-resistance regions 13c of the semiconductor film 13, and thus the conductive film 12 may play a role of causing the low-resistance regions 13c of the semiconductor film 13 to serve as a wire. In a specific but non-limiting example, a current may flow through the semiconductor film 13 and the conductive film 12 in a region where the semiconductor film 13 and the conductive film 12 are stacked in the semiconductor device 1. This may cause a portion of the semiconductor film 13, i.e., the low-resistance regions 13c, where the semiconductor film 13 makes contact with the conductive film 12 to serve as a wire.

Such a conductive film 12 may include an oxide of a metal, for example. In a specific but non-limiting example, a metal oxide including indium (In) or a metal oxide including zinc (Zn), for example, may be used for the conductive film 12. Examples of the metal oxide including indium may include indium tin oxide (ITO), indium zinc oxide (IZO), and indium gallium zinc oxide (IGZO: InGaZnO) including a highly concentrated n-type impurity. Examples of the metal oxide including zinc may include zinc oxide (ZnO) and aluminum doped zinc oxide (AZO). The conductive film 12 may be formed of a metal, such as molybdenum (Mo). In one example embodiment, the conductive film 12 may be formed of an oxide including a metal that is identical to a metal included in an oxide semiconductor material forming the semiconductor film 13. This makes it possible to stabilize the Vg-Id characteristic. Workings and effects of the above will be described below.

Figure 3A:
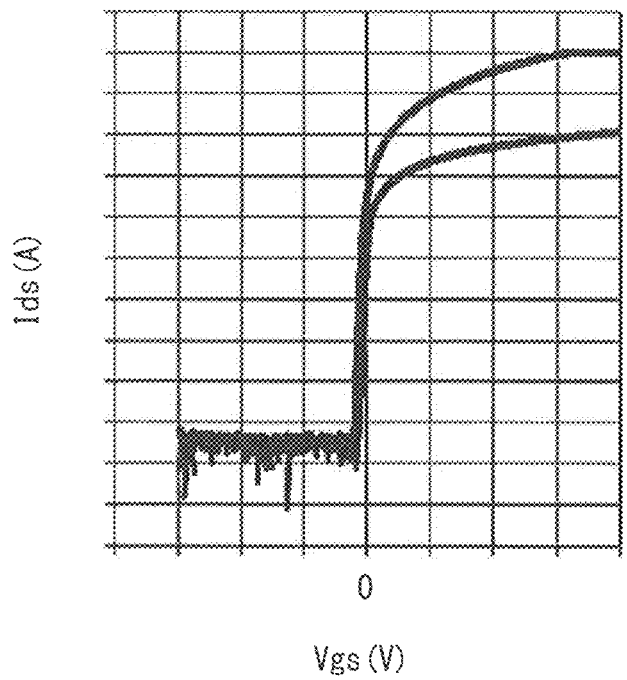
FIG. 3A is a schematic diagram illustrating an example of a Vg-Id characteristic obtained when a conductive film illustrated in FIG. 1 is formed of an oxide.
Figure 3B:
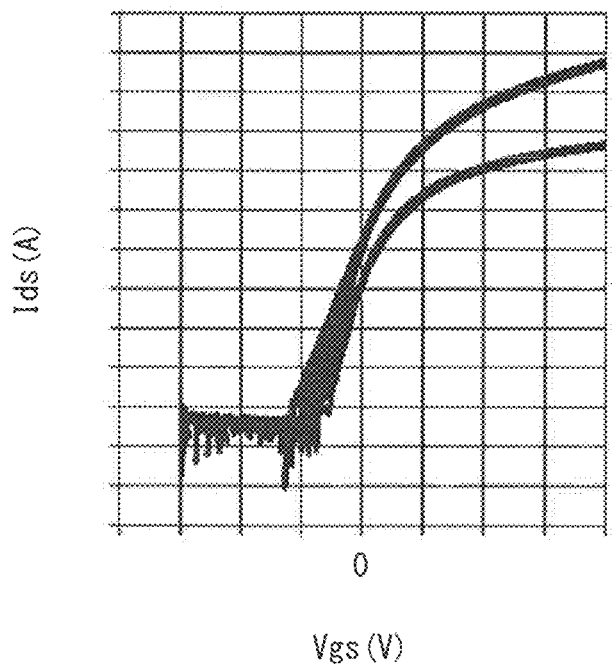
FIG. 3B is a schematic diagram illustrating an example of a Vg-Id characteristic obtained when a conductive film illustrated in FIG. 1 is formed of molybdenum (Mo).

FIGS. 3A and 3B each illustrate an example of the Vg-Id characteristic of the semiconductor device 1 in which indium gallium zinc oxide (IGZO: InGaZnO) is used for the semiconductor film 13. FIG. 3A illustrates an example of the Vg-Id characteristic of the semiconductor device 1 in which the conductive film 12 is formed of indium zinc oxide (IZO), and FIG. 3B illustrates an example of the Vg-Id characteristic of the semiconductor device 1 in which the conductive film 12 is formed of molybdenum (Mo). When the conductive film 12 is formed of a material including an element that is different from the metal(s) included in the semiconductor film 13, as illustrated from FIG. 3B, the element forming the conductive film 12 may be diffused into the semiconductor film 13, and this element may act as an impurity in the semiconductor film 13. In contrast, when the conductive film 12 is formed of an oxide including a metal that is identical to the metal(s), i.e., In and Zn, included in the semiconductor film 13, as illustrated from FIG. 3A, even if the element forming the conductive film 12 is diffused into the semiconductor film 13, this element forming the conductive film 12 may not act as an impurity in the semiconductor film 13. Accordingly, any influence on the characteristics of the thin film transistor associated with the diffusion from the conductive film 12 into the semiconductor film 13 may be suppressed, making it possible to stabilize the Vg-Id characteristic.

The conductive film 12 may have a thickness of about 2 nm to about 25 nm, for example. The presence of the conductive film 12 between the semiconductor film 13 and the substrate 11 may help suppress an occurrence of a conduction failure resulting from an increased resistance of the low-resistance region 13c even if the semiconductor film 13 is overetched when the through-holes HA and HB are formed.

An undercoat (UC) film may be provided between the substrate 11 and the conductive film 12 or between the substrate 11 and semiconductor film 13. The UC film may serve to keep a substance, such as a sodium ion, from moving into an upper layer from the substrate 11. The UC film may be formed of an insulating material, such as a silicon nitride (SiN) film or a silicon oxide (SiO) film.

The semiconductor film 13 may be provided in a selective region over the substrate 11 to cover the conductive film 12. The semiconductor film 13 may be formed of an oxide semiconductor including, as a main component, an oxide of at least one element selected from indium (In), gallium (Ga), zinc (Zn), tin (Sn), titanium (Ti), and niobium (Nb), for example. In a specific but non-limiting example, indium tin zinc oxide (ITZO), indium gallium zinc oxide (IGZO: InGaZnO), zinc oxide (ZnO), indium zinc oxide (IZO), indium gallium oxide (IGO), indium tin oxide (ITO), or indium oxide (InO), for example, may be used for the semiconductor film 13. The semiconductor film 13 may have a thickness of 10 nm to 300 nm, for example. The semiconductor film 13 may have a thickness of no more than 60 nm, for example. As the thickness of the semiconductor film 13 is reduced, the absolute amount of a defect in the semiconductor may be reduced, and a negative shift in the threshold voltage may be suppressed. Accordingly, it is possible to achieve excellent transistor characteristics with a high on/off ratio. Furthermore, the time it takes to deposit the semiconductor film 13 may be reduced, making it possible to improve the productivity. The carrier concentration in the semiconductor film 13 at the channel region 13a opposed to the gate electrode 15 may be no higher than $1 \times 10^{17}$ cm$^{-3}$, for example.

In the present example embodiment, the intermediate regions 13b may be provided between the channel region 13a and the respective low-resistance regions 13c. This makes it possible to adjust the carrier concentration in the intermediate regions 13b of the semiconductor film 13 and to reduce a diffusion length, i.e., a diffusion length dL illustrated in FIG. 7 described later, for an oxygen vacancy donor to be diffused into the channel region 13a from the intermediate regions 13b. Details on this point will be described later.

The intermediate regions 13b may be provided on the respective sides of the channel region 13a. The carrier concentration in the intermediate regions 13b of the semiconductor film 13 may be higher than the carrier concentration in the channel region 13a of the semiconductor film 13, for example. For example, the carrier concentration in the intermediate regions 13b of the semiconductor film 13 may be no lower than $1 \times 10^{18}$ cm$^{-3}$ nor higher than $1.4 \times 10^{20}$ cm$^{-3}$. For example, in order to make the semiconductor film 13 serve as a wire, the carrier concentration in the semiconductor film 13 may need to be higher than $1.4 \times 10^{20}$ cm$^{-3}$.

Since the intermediate regions 13b of the semiconductor film 13 do not need to serve as a wire, the carrier concentration in the intermediate regions 13b of the semiconductor film 13 may not need to be adjusted to a higher carrier concentration. Furthermore, as will be described later, adjusting the carrier concentration in the intermediate regions 13b of the semiconductor film 13 to a lower carrier concentration makes it possible to effectively reduce the diffusion length for an oxygen vacancy donor to be diffused into the channel region 13a from the intermediate regions 13b. In other words, adjusting the carrier concentration in the intermediate regions 13b of the semiconductor film 13 to a lower carrier concentration may keep the intermediate regions 13b from extending into the channel region 13a. Accordingly, an increase in the width of a region where the gate electrode 15 overlaps a region of the semiconductor film 13 where the carrier concentration is high may be suppressed, and this makes it possible to suppress an increase in the parasitic capacitance therebetween.

The intermediate regions 13b may each have a dimension of no less than 1 μm nor more than 3 μm in a channel length direction, i.e., in an X-axis direction in FIGS. 1 and 2, for example. Setting the dimension of each intermediate region 13b in the channel length direction to no less than 1 μm may suppress an overlap between the conductive film 12 and the channel region 13a of the semiconductor film 13 that could result from an alignment error. Accordingly, this makes it possible to suppress a decrease in the yield rate that could result from an alignment error. Setting the dimension of each intermediate region 13b in the channel length direction to no less than 1 μm may also keep an oxygen vacancy donor in the low-resistance regions 13c from reaching the channel region 13a via the intermediate regions 13b. Meanwhile, setting the dimension of each intermediate region 13b in the channel length direction to no more than 3 μm may suppress an increase in the resistance in the region served by the intermediate regions 13b between the channel region 13a and the respective low-resistance regions 13c.

The low-resistance regions 13c of the semiconductor film 13 may be provided to the respective sides of the channel region 13a with the respective intermediate regions 13b interposed therebetween. The source-drain electrode 18A may be coupled to one of the low-resistance regions 13c, and the source-drain electrode 18B may be coupled to another one of the low-resistance regions 13c. The carrier concentration in the low-resistance regions 13c of the semiconductor film 13 may be substantially equal to the carrier concentration in the intermediate regions 13b of the semiconductor film 13, for example, and may be no lower than $1 \times 10^{18}$ cm$^{-3}$ nor higher than $1.4 \times 10^{20}$ cm$^{-3}$. In this example, since the conductive film 12 is in contact with the low-resistance regions 13c of the semiconductor film 13, it is possible to maintain sufficient conductivity with the conductive film 12 even when the carrier concentration in the low-resistance regions 13c of the semiconductor film 13 is substantially equal to the carrier concentration in the intermediate regions 13b. Upper surfaces of the intermediate regions 13b and the low-resistance regions 13c of the semiconductor film 13 may be covered by the metal oxide film 16.

As illustrated in FIG. 2, the gate insulating film 14 provided between the semiconductor film 13, i.e., the channel region 13a, and the gate electrode 15 may have a shape identical to the shape of the gate electrode 15, as viewed in a plan view, for example. To rephrase, the gate insulating film 14 and the gate electrode 15 may have substantially the same planar shape. In other words, the semiconductor device 1 may have a thin film transistor of a so-called self-aligned structure. This makes it possible to suppress an occurrence of a parasitic capacitance between the gate electrode 15 and the intermediate regions 13b of the semiconductor film 13. The gate insulating film 14 may be a monolayer film formed by one film selected from a silicon oxide film (SiO), a silicon nitride film (SiN), a silicon oxynitride film (SiON), and an aluminum oxide film (AlO) or may be a laminated film formed by two or more of the above.

The gate electrode 15 on the gate insulating film 14 may have control the carrier concentration in the channel region 13a in accordance with an applied gate voltage (Vg) and may also serve as a wire that supplies a potential. The material forming the gate electrode 15 may be a single substance including one element selected from titanium (Ti), tungsten (W), tantalum (Ta), aluminum (Al), molybdenum (Mo), silver (Ag), neodymium (Nd), and copper (Cu) or may be an alloy of the above, for example. Alternatively, the material forming the gate electrode 15 may be a compound including at least one element selected from the above or a laminated film including two or more elements selected from the above. Furthermore, a transparent conductive film of, for example but not limited to, ITO may also be used.

The metal oxide film 16 may be provided over an entire surface of the substrate 11, for example. The metal oxide film 16 may be formed by, for example but not limited to, an aluminum oxide (AlO) film. The metal oxide film 16 may cover the gate electrode 15 and may also be in contact with the intermediate regions 13b and the low-resistance regions 13c of the semiconductor film 13. The presence of the metal oxide film 16 that is in contact with the intermediate regions 13b and the low-resistance regions 13c in this manner makes it possible to suppress a change in the carrier concentration in the intermediate regions 13b and the low-resistance regions 13c. Workings and effects of the above will be described below.

Figure 4:
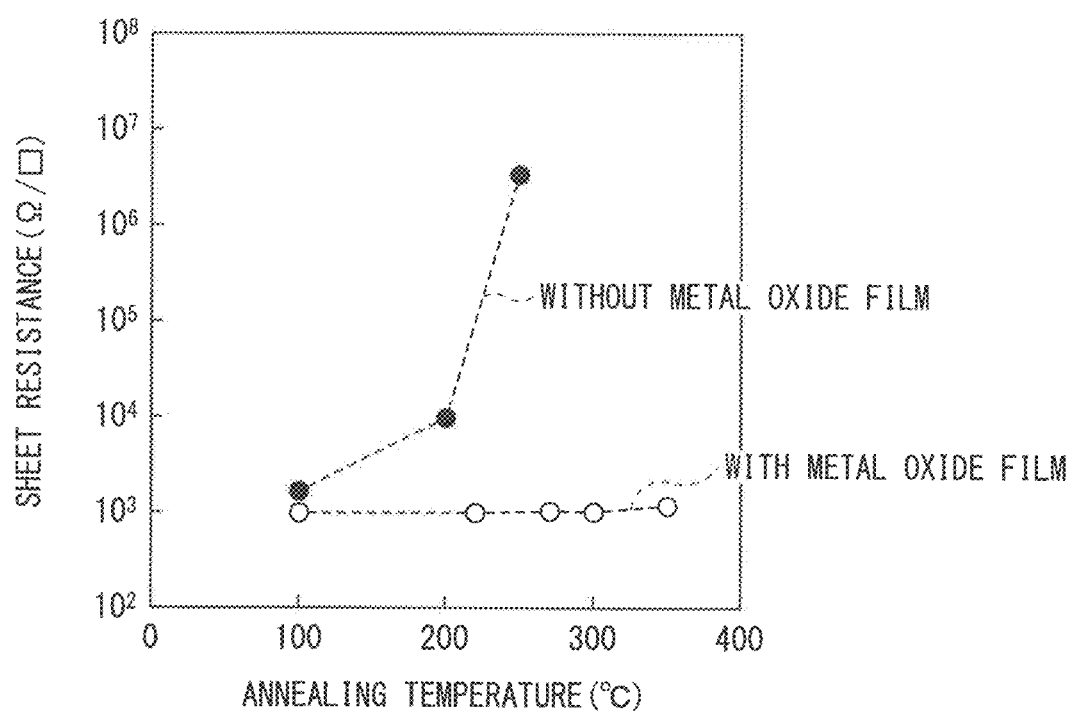
FIG. 4 illustrates an example of a relationship between an annealing temperature and a sheet resistance of a semiconductor film.

FIG. 4 illustrates an example of a relationship between an annealing temperature and a sheet resistance of the semiconductor film 13. In FIG. 4, results from the presence and the absence of the metal oxide film 16 over the semiconductor film 13 are compared. Covering the semiconductor film 13 with the metal oxide film 16 may suppress a rise in the sheet resistance of the semiconductor film 13 even in a case where the annealing temperature is raised. One reason for this is that covering the semiconductor film 13 with the metal oxide film 16 suppresses an extinction of an oxygen vacancy donor in the semiconductor film 13 that could result from the diffusion of oxygen into the semiconductor film 13 from a layer, e.g., the interlayer insulating film 17, above the metal oxide film 16. In this manner, covering the semiconductor film 13 with the metal oxide film 16 suppresses an increase in the resistance of the semiconductor film 13, i.e., the intermediate regions 13b and the low-resistance regions 13c, that could result from a change in the carrier concentration in the intermediate regions 13b and the low-resistance regions 13c.

The interlayer insulating film 17 may be provided over an entire surface of the substrate 11, for example. The through-holes HA and HB may be provided at positions opposed to the respective low-resistance regions 13c of the semiconductor film 13. The through-holes HA and HB may penetrate through the interlayer insulating film 17 and the metal oxide film 16. As illustrated in FIG. 2, the through-holes HA and HB may each have a rectangular planar shape, for example. The through-holes HA and HB may each have another planar shape, such as a circular shape, for example. The interlayer insulating film 17 may be formed by a laminated film of an inorganic insulating film and an organic insulating film. For example, on the metal oxide film 16, the inorganic insulating film and the organic insulating film may be stacked in this order. The inorganic insulating film may be formed by, for example but not limited to, a silicon oxide (SiO) film, a silicon nitride (SiN) film, or a silicon oxynitride (SiON) film, for example. A resin film having a photosensitive property may be used for the organic insulating film, for example. In a specific but non-limiting example, the organic insulating film included in the interlayer insulating film 17 may be formed by a polyimide resin film, for example. Resin such as a novolac resin or an acrylic resin may be used for the organic insulating film. The interlayer insulating film 17 may further include, for example but not limited to, an aluminum oxide (AlO) film between the inorganic insulating film and the organic insulating film.

The source-drain electrodes 18A and 18B may each serve as a source or a drain of the thin film transistor. The source-drain electrodes 18A and 18B may each include a transparent conductive film or a metal similar to the metals listed above as examples of the material forming the gate electrode 15, for example. In one example embodiment, a material having a high electrical conductivity may be selected as the material of the source-drain electrodes 18A and 18B. The source-drain electrodes 18A and 18B may each have a structure in which titanium (Ti) having a thickness of 50 nm, aluminum silicon (AlSi) having a thickness of 500 nm, and titanium (Ti) having a thickness of 50 nm are stacked in this order, for example. The source-drain electrodes 18A and 18B may be buried in the respective through-holes HA and HB in the interlayer insulating film 17 and may be in contact with the semiconductor film 13, i.e., the low-resistance regions 13c.

[Manufacturing Method]

The semiconductor device 1 described above may be manufactured in the following manner, for example, as illustrated in FIGS. 5A to 5M.

Figure 5A:
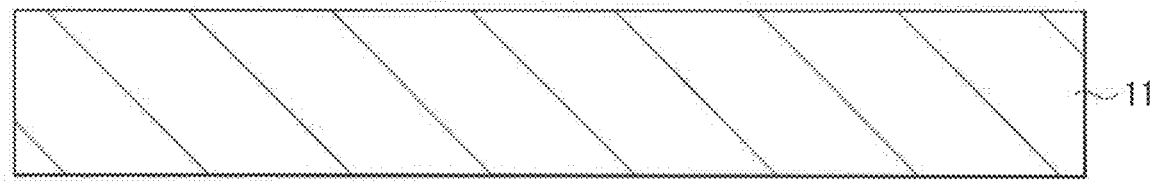
FIG. 5A is a cross-sectional schematic diagram illustrating an example of one process in a method of manufacturing the semiconductor device illustrated in FIG. 1.
Figure 5B:
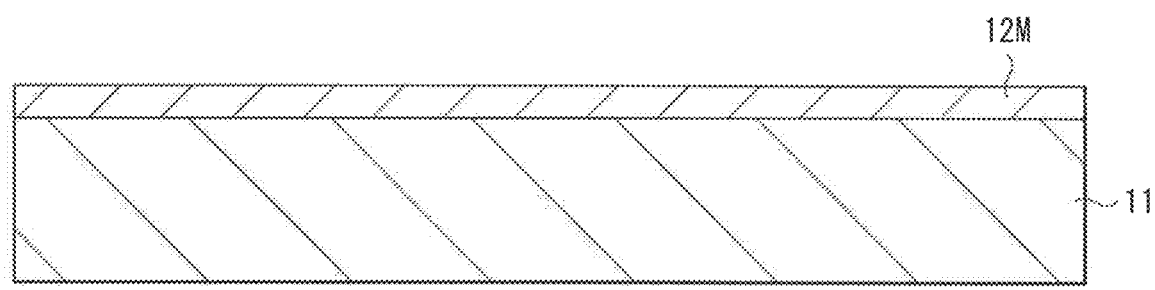
FIG. 5B is a cross-sectional schematic diagram illustrating an example of a process that follows the process illustrated in FIG. 5A.
Figure 5C:
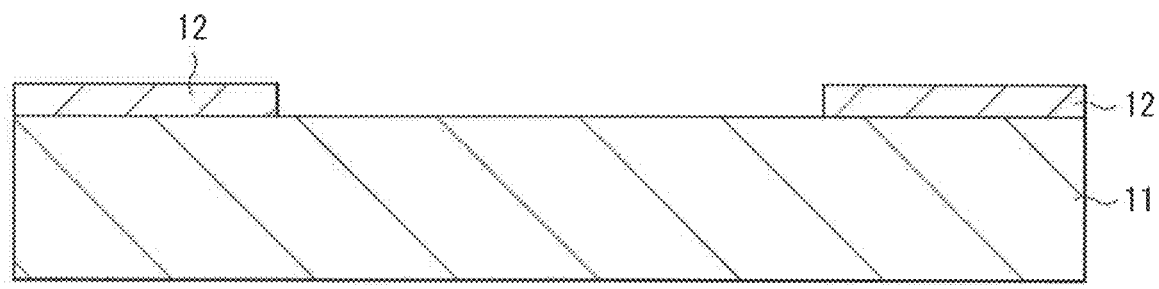
FIG. 5C is a cross-sectional schematic diagram illustrating an example of a process that follows the process illustrated in FIG. 5B.

First, as illustrated in FIG. 5A, the substrate 11 may be prepared. A UC film (not illustrated) may be formed on the substrate 11. Thereafter, as illustrated in FIG. 5B, a conductive material film 12M may be formed on the substrate 11. The conductive film 12 may be formed from the conductive material film 12M in a later process. When the conductive material film 12M is formed, IZO may be deposited over an entire surface of the substrate 11 through sputtering, for example. Thereafter, as illustrated in FIG. 5C, the conductive material film 12M may be patterned into a predetermined shape through photolithography and wet etching. Thus, the conductive film 12 may be formed in a selective region on the substrate 11.

Figure 5D:
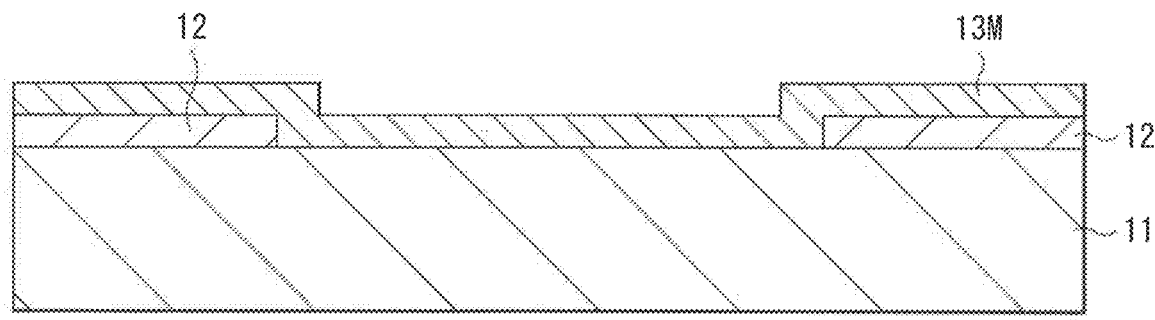
FIG. 5D is a cross-sectional schematic diagram illustrating an example of a process that follows the process illustrated in FIG. 5C.
Figure 5E:
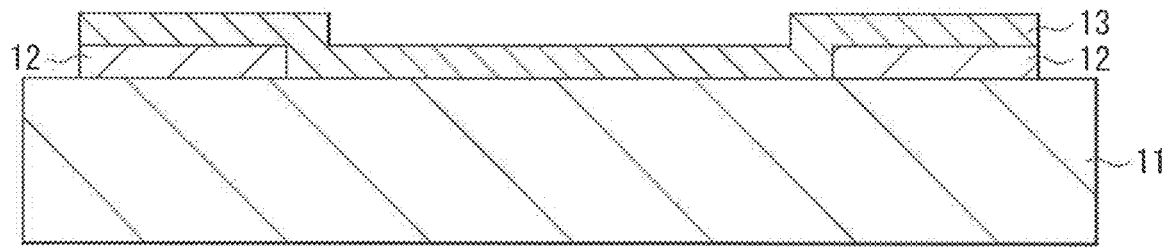
FIG. 5E is a cross-sectional schematic diagram illustrating an example of a process that follows the process illustrated in FIG. 5D.

After the conductive film 12 has been formed on the substrate 11, as illustrated in FIG. 5D, a semiconductor material film 13M may be formed over an entire surface of the substrate 11 to cover the conductive film 12. The semiconductor film 13 may be formed from the semiconductor material film 13M in a later process. When the semiconductor material film 13M is formed, an oxide semiconductor material may be deposited over the substrate 11 through sputtering, for example. Thereafter, as illustrated in FIG. 5E, the semiconductor material film 13M may be patterned into a predetermined shape through photolithography and wet etching, for example. At this point, the semiconductor material film 13M may be so patterned as to allow a portion, i.e., later-formed low-resistance regions 13c, of the semiconductor film 13 to cover the conductive film 12. Thus, the semiconductor film 13 may be formed. In this example, the semiconductor film 13 may be formed after the conductive film 12 has been formed. Therefore, any deterioration of the semiconductor film 13 that could result from the process of forming the conductive film 12 may be suppressed.

Figure 5F:
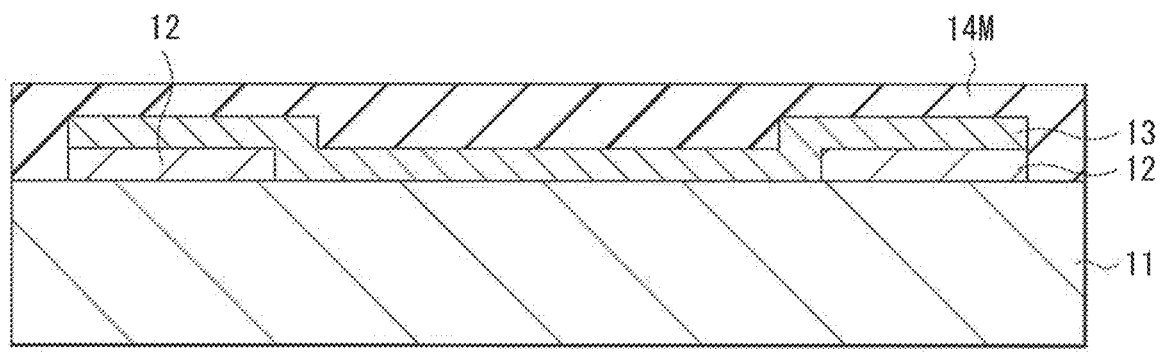
FIG. 5F is a cross-sectional schematic diagram illustrating an example of a process that follows the process illustrated in FIG. 5E.
Figure 5G:
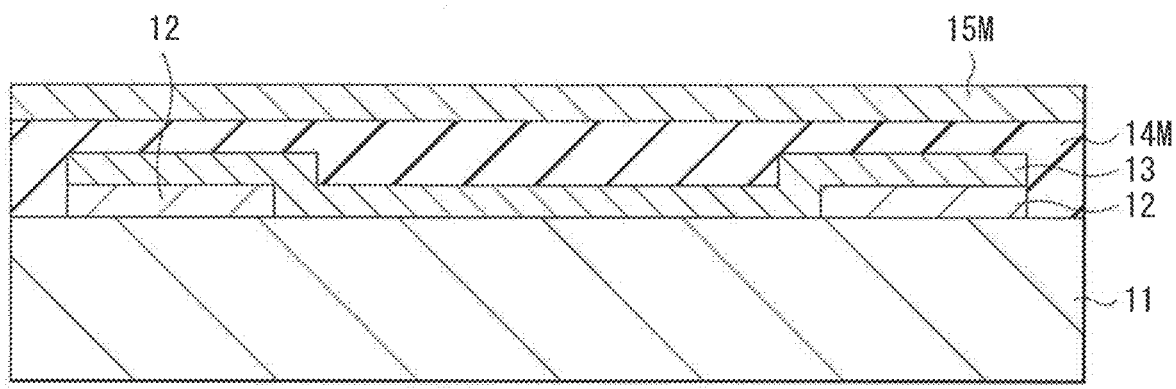
FIG. 5G is a cross-sectional schematic diagram illustrating an example of a process that follows the process illustrated in FIG. 5F.

Thereafter, as illustrated in FIGS. 5F and 5G, an insulating film 14M and an electrode film 15M may be formed in this order over an entire surface of the substrate 11 to cover the semiconductor film 13. The gate insulating film 14 may be formed from the insulating film 14M in a later process, and the gate electrode 15 may be formed from the electrode film 15M in a later process. When the insulating film 14M is formed, silicon oxide (SiO) may be deposited to a thickness of 200 nm through a chemical vapor deposition (CVD) technique, for example. When the electrode film 15M is formed, layers of titanium (Ti), aluminum (Al), and titanium (Ti) may be stacked in this order, for example.

Figure 5H:
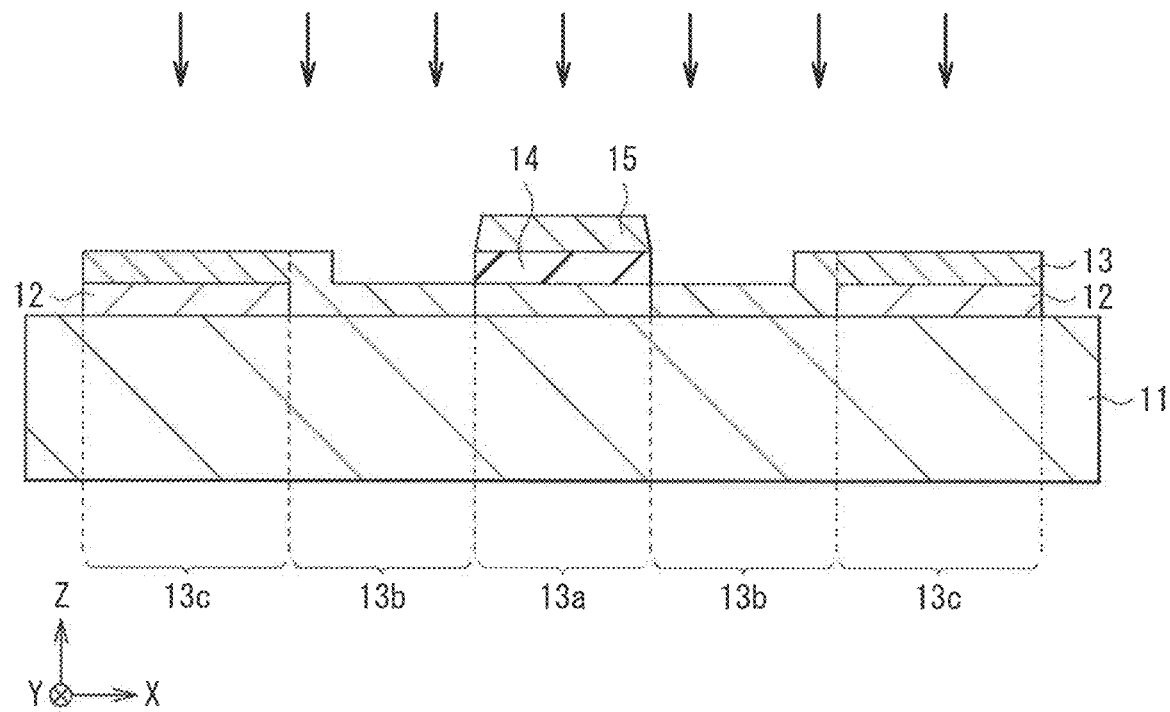
FIG. 5H is a cross-sectional schematic diagram illustrating an example of a process that follows the process illustrated in FIG. 5G.

Thereafter, as illustrated in FIG. 5H, the electrode film 15M and the insulating film 14M may be patterned successively, and the gate electrode 15 and the gate insulating film 14 may be formed. When the electrode film 15M and the insulating film 14M are patterned, a photoresist having a predetermined pattern may be formed on the electrode film 15M, and dry etching may be performed with this photoresist, for example. At this point, a region of the semiconductor film 13 where the semiconductor film 13 is exposed through the gate insulating film 14 may have its resistance reduced through dry etching, and the intermediate regions 13b and the low-resistance regions 13c may be formed, for example. At this point, the carrier concentration in the intermediate regions 13b and the low-resistance regions 13c of the semiconductor film 13 may be adjusted to no lower than $1 \times 10^{18}$ cm$^{-3}$ nor higher than $1.4 \times 10^{20}$ cm$^{-3}$, for example. Alternatively, the intermediate regions 13b and the low-resistance regions 13c of the semiconductor film 13 may be subjected to a plasma treatment or an ion implantation thereafter, and the carrier concentration in the intermediate regions 13b and the low-resistance regions 13c of the semiconductor film 13 may be adjusted to no lower than $1 \times 10^{18}$ cm$^{-3}$ nor higher than $1.4 \times 10^{20}$ cm$^{-3}$.

Figure 5I:
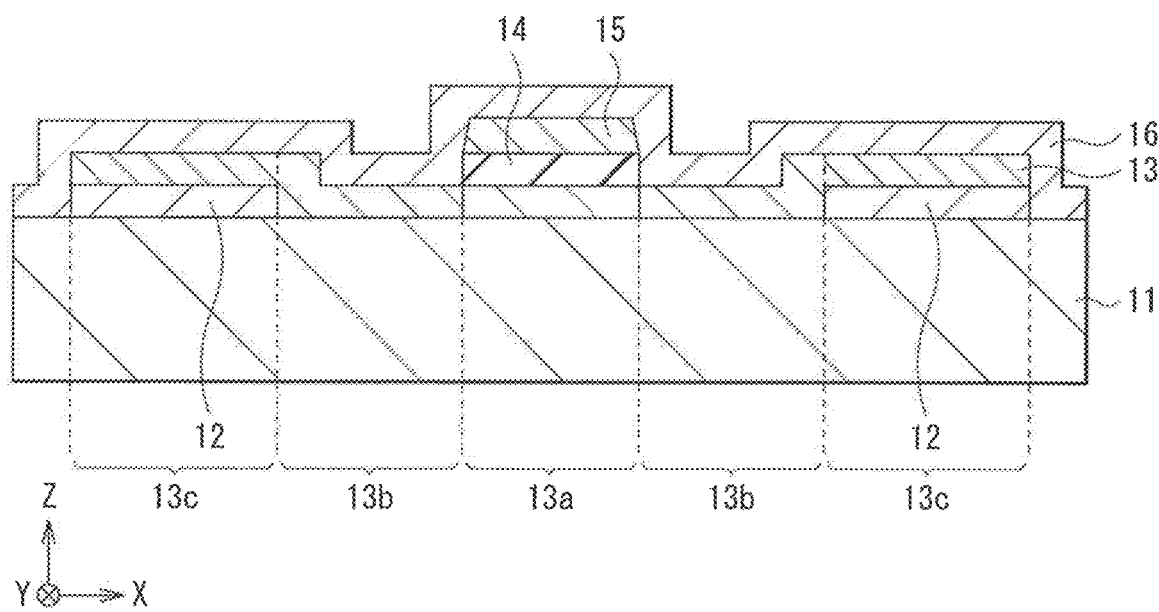
FIG. 5I is a cross-sectional schematic diagram illustrating an example of a process that follows the process illustrated in FIG. 5H.

After the gate electrode 15 and the gate insulating film 14 are formed, the metal oxide film 16 may be formed over an entire surface of the substrate 11, as illustrated in FIG. 5I. The metal oxide film 16 may be formed by depositing aluminum oxide (AlO) through sputtering, for example. When the metal oxide film 16 is formed, the carrier concentration in the intermediate regions 13b and the low-resistance regions 13c of the semiconductor film 13 may be adjusted to no lower than $1 \times 10^{18}$ cm$^{-3}$ nor higher than $1.4 \times 10^{20}$ cm$^{-3}$, for example.

After the metal oxide film 16 has been formed, an annealing treatment may be performed. With the diffusion of oxygen from the gate insulating film 14 in the annealing treatment, the carrier concentration in the channel region 13a of the semiconductor film 13 may be adjusted to no higher than $1 \times 10^{17}$ cm$^{-3}$, for example.

Figure 5J:
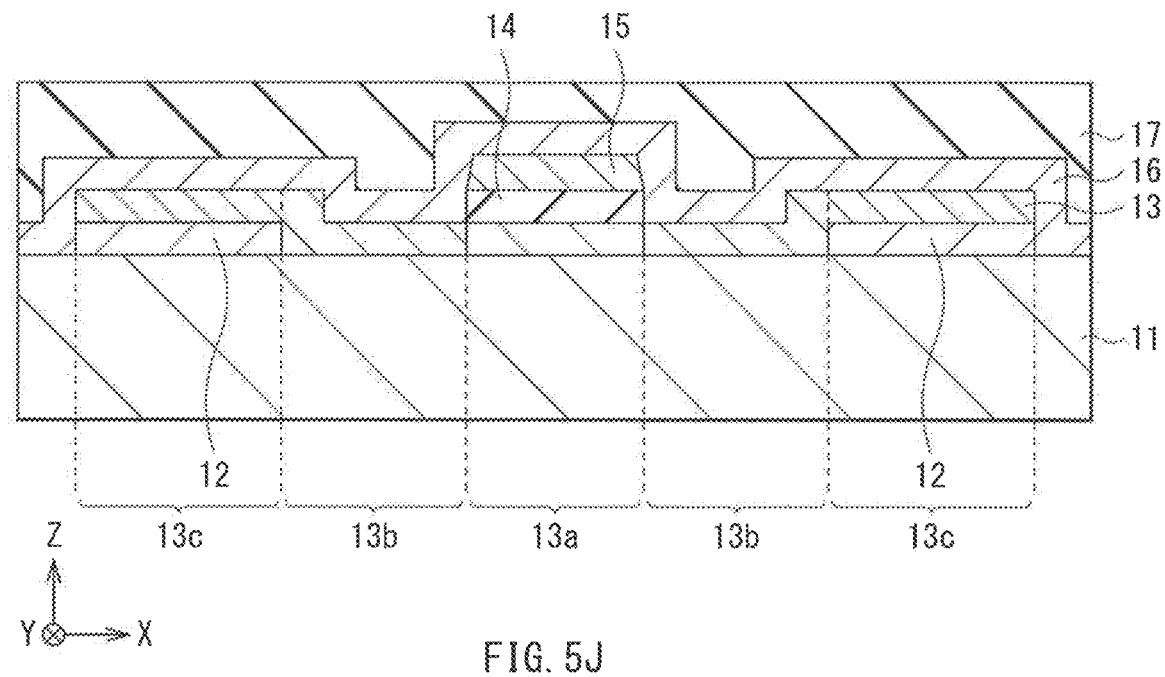
FIG. 5J is a cross-sectional schematic diagram illustrating an example of a process that follows the process illustrated in FIG. 5I.
Figure 5K:
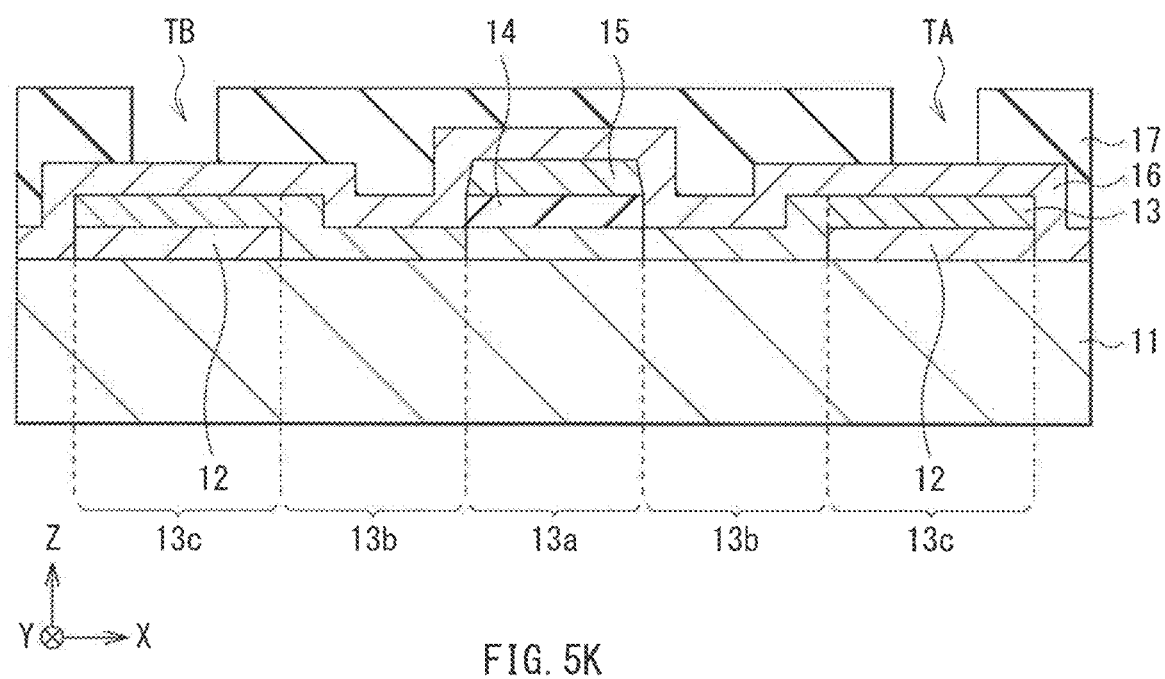
FIG. 5K is a cross-sectional schematic diagram illustrating an example of a process that follows the process illustrated in FIG. 5J.
Figure 5L:
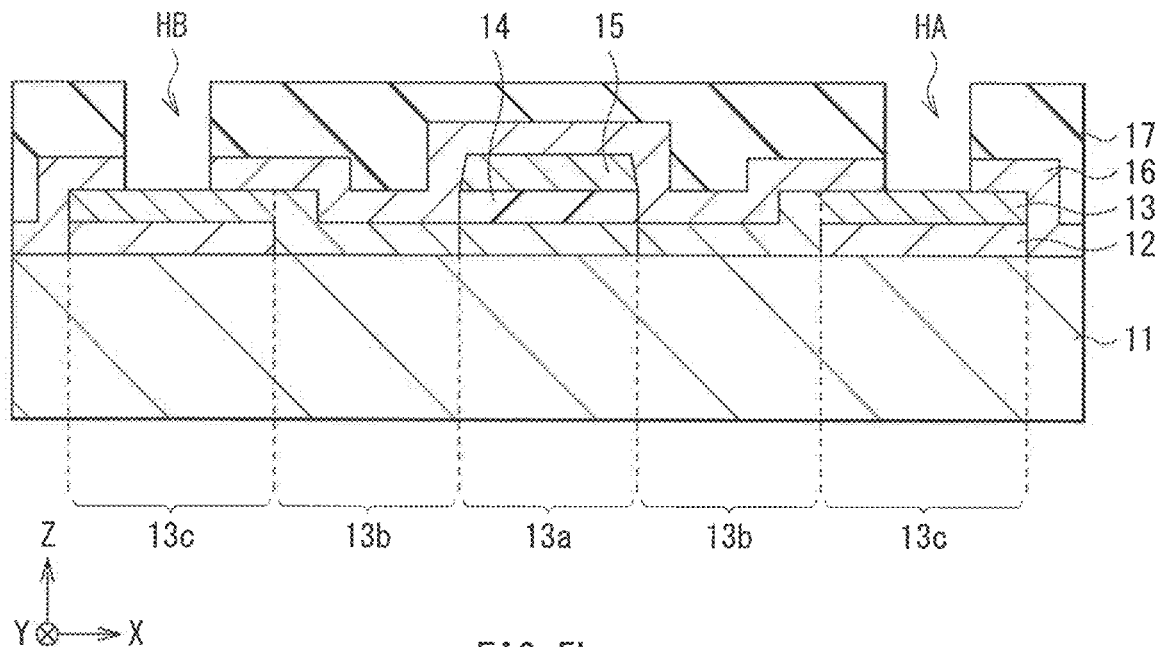
FIG. 5L is a cross-sectional schematic diagram illustrating an example of a process that follows the process illustrated in FIG. 5K.

After the metal oxide film 16 has been formed, the interlayer insulating film 17 may be formed over an entire surface of the substrate 11, as illustrated in FIG. 5J. Thereafter, as illustrated in FIG. 5K, groove portions TA and TB may be formed in the interlayer insulating film 17 through photolithography and dry etching, for example. The groove portions TA and TB may be formed at positions opposed to the respective low-resistance regions 13c of the semiconductor film 13. The groove portions TA and TB may each be so formed as to have the metal oxide film 16 as its bottom surface, for example.

Figure 5M:
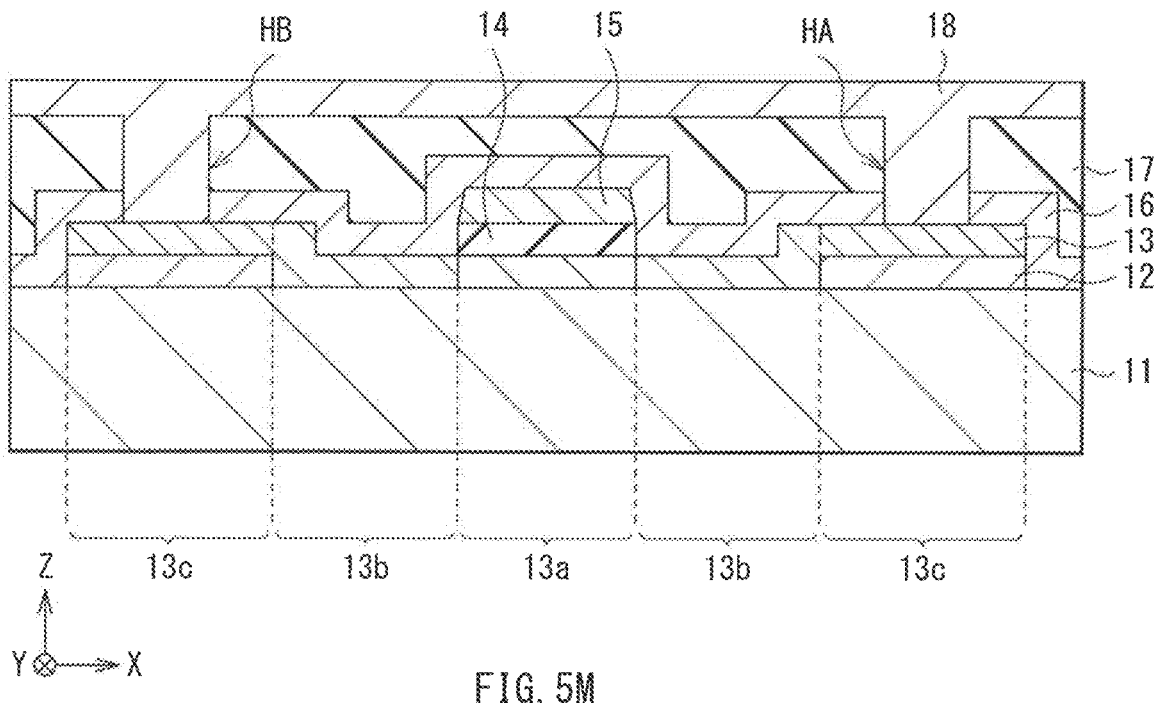
FIG. 5M is a cross-sectional schematic diagram illustrating an example of a process that follows the process illustrated in FIG. 5L.

Thereafter, as illustrated in 5L, the metal oxide film 16 serving as the bottom surfaces of the groove portions TA and TB may be removed, and the through-holes HA and HB may be formed. Thereafter, as illustrated in FIG. 5M, an electrode film 18M may be formed on the interlayer insulating film 17. Thereafter, the electrode film 18M may be patterned to form the source-drain electrodes 18A and 18B. In this manner, the semiconductor device 1 illustrated in FIGS. 1 and 2 may be completed.

[Operation]

In the semiconductor device 1 according to the present example embodiment, when an on-voltage of no lower than a threshold voltage is applied to the gate electrode 15, the channel region 13a of the semiconductor film 13 may be activated. This may cause a current to flow between the low-resistance regions 13c.

Example Workings and Example Effects

In the semiconductor device 1 according to the present example embodiment, the intermediate regions 13b may be provided between the channel region 13a and the respective low-resistance regions 13c of the semiconductor film 13. This makes it possible to adjust the carrier concentration in the intermediate regions 13b of the semiconductor film 13 and to reduce the diffusion length for an oxygen vacancy donor to be diffused into the channel region 13a from the intermediate regions 13b. Workings and effects of the above will be described below with reference to some comparative examples.

Figure 6:
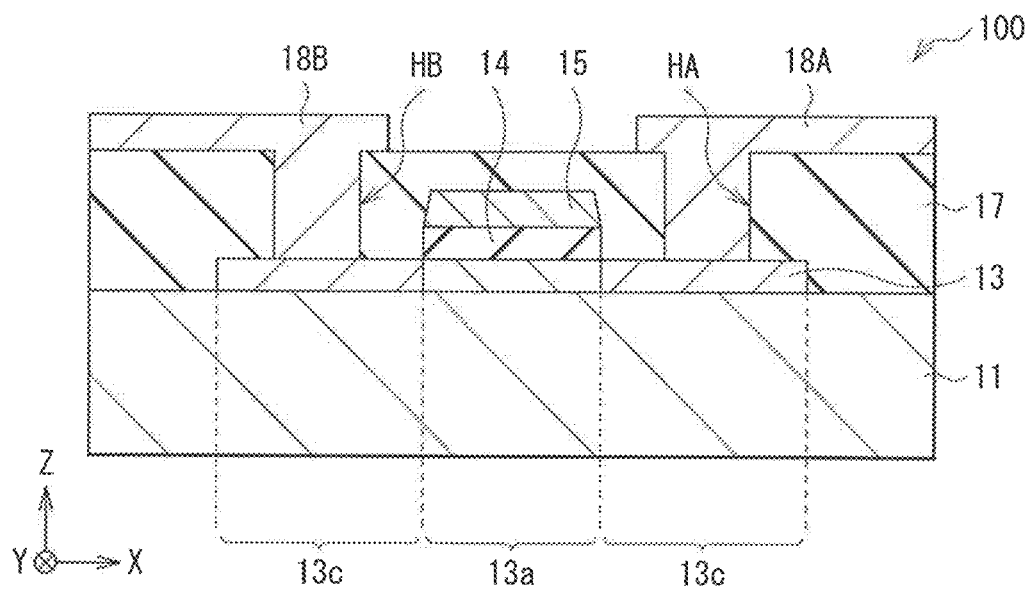
FIG. 6 is a schematic diagram illustrating a cross-sectional configuration of a main portion of a semiconductor device according to a comparative example.

FIG. 6 illustrates a schematic cross-sectional configuration of a main portion of a semiconductor device, i.e., a semiconductor device 100, according to a comparative example. FIG. 6 corresponds to FIG. 1 illustrating the semiconductor device 1. The semiconductor device 100 includes a thin film transistor of a self-aligned structure. In the semiconductor device 100, a semiconductor film 13, a gate insulating film 14, a gate electrode 15, an interlayer insulating film 17, and source-drain electrodes 18A and 18B are provided over a substrate 11. The semiconductor device 100 does not include a conductive film, i.e., the conductive film 12 illustrated in FIG. 1, that is in contact with the semiconductor film 13. Furthermore, in the semiconductor film 13 of the semiconductor device 100, low-resistance regions 13c are provided adjacent to a channel region 13a. In other words, no intermediate region, i.e., the intermediate regions 13b illustrated in FIG. 1, is provided between the channel region 13a and the low-resistance regions 13c. The carrier concentration in the low-resistance regions 13c of the semiconductor film 13 is higher than $1.4 \times 10^{20}$ cm$^{-3}$. In these respects, the semiconductor device 100 differs from the semiconductor device 1.

Figure 7:
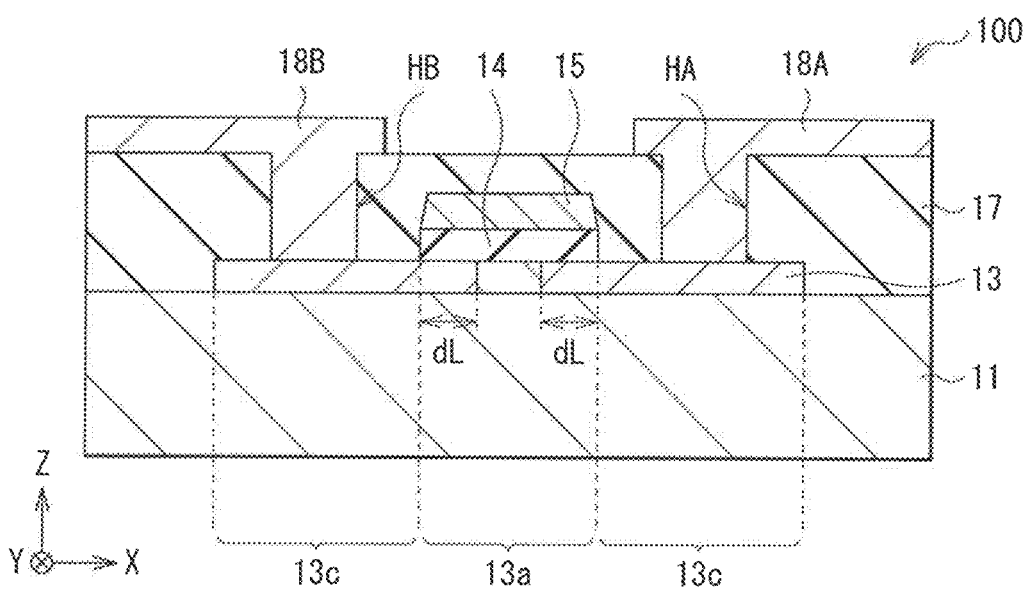
FIG. 7 is a cross-sectional schematic diagram for describing a diffusion length in the semiconductor device illustrated in FIG. 6.

FIG. 7 illustrates a diffusion length dL in the semiconductor film 13 of the semiconductor device 100. In the semiconductor film 13 of the semiconductor device 100, the low-resistance regions 13c having a high carrier concentration are provided adjacent to the channel region 13a. Therefore, the diffusion length dL for an oxygen vacancy donor to be diffused into the channel region 13a from the low-resistance regions 13c is more likely to increase. As the diffusion length dL increases, a threshold voltage Vth is more likely to shift in the negative direction. In particular, when the channel length is reduced, the threshold voltage Vth shifts more prominently.

Figure 8:
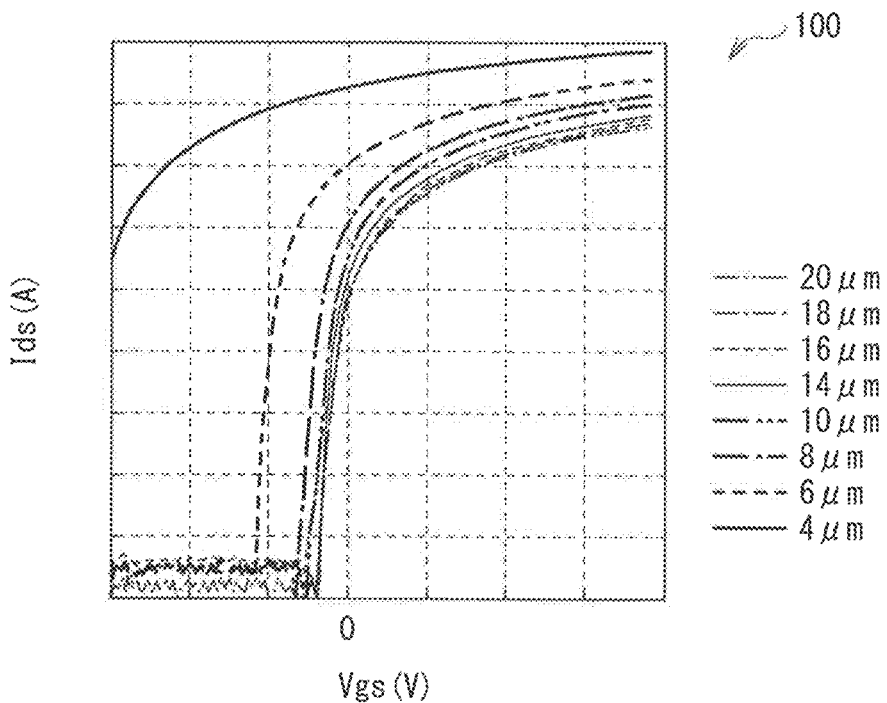
FIG. 8 schematically illustrates a Vg-Id characteristic of the semiconductor device illustrated in FIG. 6.

FIG. 8 illustrates results of measuring a Vg-Id characteristic of the semiconductor device 100 with varied channel lengths. The Vg-Id characteristic is measured with the channel length varied from 4 µm to 20 µm. In this manner, the threshold voltage Vth greatly shifts in the negative direction as the channel length is reduced. Therefore, it is difficult to reduce the channel length of the thin film transistor in the semiconductor device 100, and this leads to a reduced flexibility in the circuit design.

In contrast, in the semiconductor device 1, the intermediate regions 13b may be provided between the channel region 13a and the respective low-resistance regions 13c of the semiconductor film 13. Therefore, the carrier concentration in the intermediate regions 13b of the semiconductor film 13 may be adjusted to a relatively low carrier concentration. For example, whereas the carrier concentration in the low-resistance regions 13c of the semiconductor film 13 in the semiconductor device 100 is higher than $1.4 \times 10^{20}$ $cm^{-3}$, the carrier concentration in the intermediate regions 13b of the semiconductor film 13 in the semiconductor device 1 may be no higher than $1.4 \times 10^{20}$ $cm^{-3}$. One reason for this is that the intermediate regions 13b of the semiconductor film 13 do not play a role of a wire. In this manner, as the carrier concentration in the intermediate regions 13b of the semiconductor film 13 is adjusted to a lower carrier concentration, the diffusion length dL for an oxygen vacancy donor to be diffused into the channel region 13a from the intermediate regions 13b may be reduced.

Figure 9:
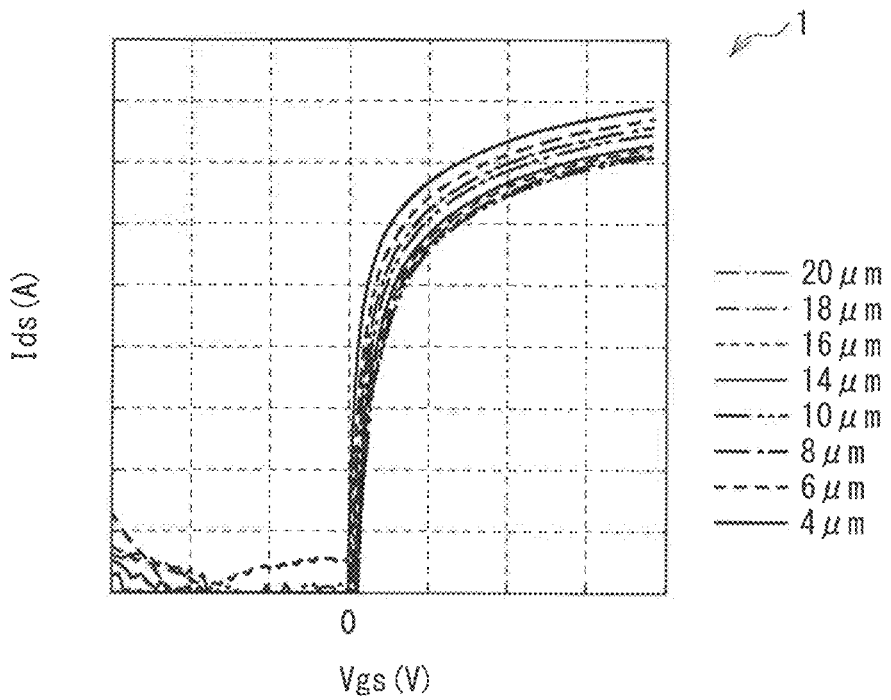
FIG. 9 schematically illustrates an example of a Vg-Id characteristic of the semiconductor device illustrated in FIG. 1.

FIG. 9 illustrates results of measuring the Vg-Id characteristic of the semiconductor device 1 with varied channel lengths. The Vg-Id characteristic may be measured with the channel length varied from 4 µm to 20 µm. In this manner, in the semiconductor device 1, even when the channel length is reduced to about 4 µm, for example, it is possible to suppress a shift in the threshold voltage Vth and to maintain the characteristics stably. This makes it possible to use a thin film transistor having a small channel length in the semiconductor device 1, making it possible to improve the flexibility in the circuit design, as compared with the semiconductor device 100.

Figure 10:
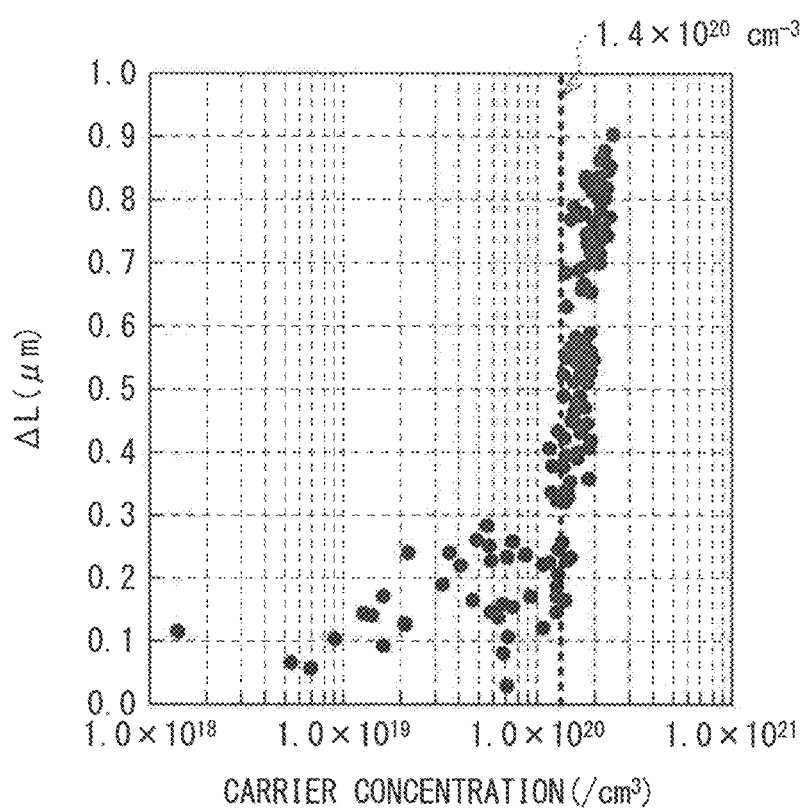
FIG. 10 illustrates an example of a relationship between a carrier concentration and a diffusion length in a semiconductor film.

FIG. 10 illustrates an example of a relationship between the carrier concentration in the intermediate regions 13b of the semiconductor film 13 and the diffusion length dL. In this manner, setting the carrier concentration in the intermediate regions 13b of the semiconductor film 13 to no higher than $1.4 \times 10^{20}$ $cm^{-3}$ makes it possible to effectively reduce the diffusion length dL.

Furthermore, in the semiconductor device 1, the conductive film 12 that is in contact with the low-resistance regions 13c of the semiconductor film 13 may be provided. Therefore, even if the carrier concentration in the low-resistance regions 13c of the semiconductor film 13 is substantially equal to the carrier concentration in the intermediate regions 13b of the semiconductor film 13, it is possible to ensure the conductivity in the vicinity of the low-resistance regions 13c. Accordingly, it is possible to reduce the diffusion length dL more effectively.

As described thus far, in the present example embodiment, the intermediate regions 13b may be provided between the channel region 13a and the respective low-resistance regions 13c of the semiconductor film 13. Therefore, it is possible to more freely adjust the carrier concentration in the intermediate regions 13b of the semiconductor film 13. This makes it possible to reduce the diffusion length for an oxygen vacancy donor to be diffused into the channel region 13a from the intermediate regions 13b. Accordingly, it is possible to suppress a variation in the characteristics, such as the threshold voltage Vth, associated with the channel length.

Furthermore, forming the semiconductor film 13 after the conductive film 12 has been formed makes it possible to suppress a deterioration of the semiconductor film 13 that could result from the process of forming the conductive film 12. Accordingly, it is possible to suppress a variation in the characteristics that could result from a deterioration of the semiconductor film 13 in the manufacturing process.

Another example embodiment and modification examples will be described below. In the following description, configurations that are identical to those of the foregoing example embodiment are given identical reference characters, and description thereof will be omitted as appropriate.

2. Second Example Embodiment

Figure 11:
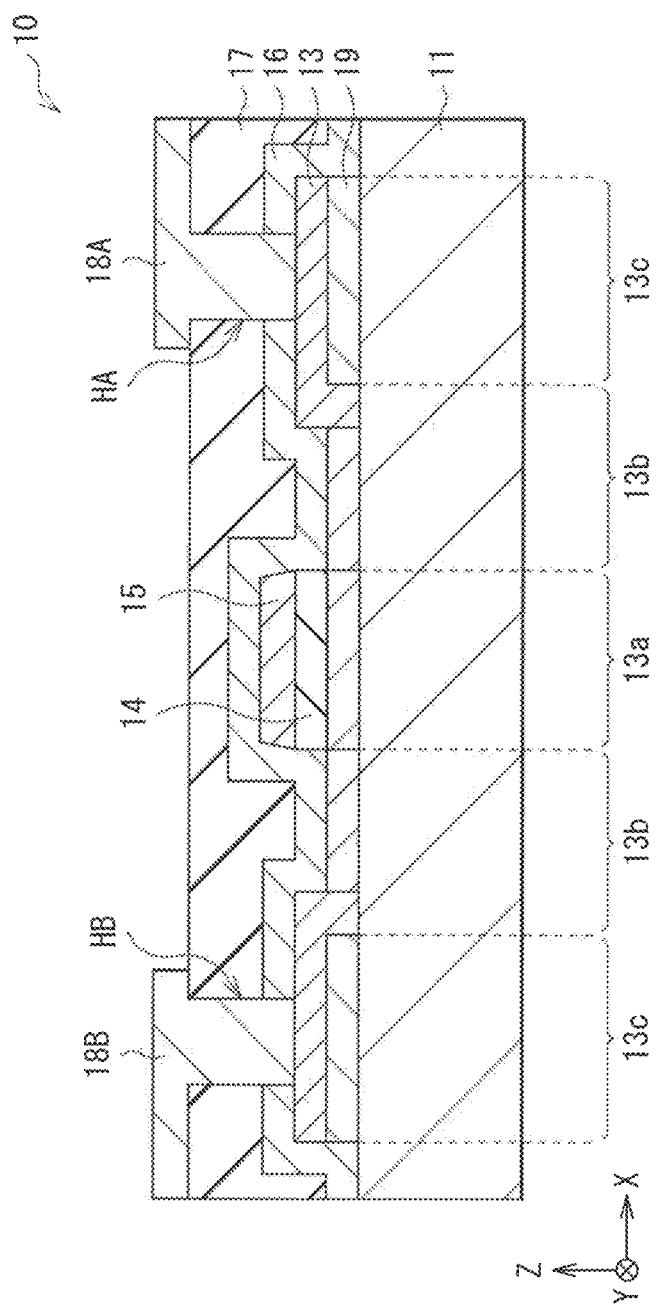
FIG. 11 is a cross-sectional schematic diagram illustrating an example of a configuration of a main portion of a semiconductor device according to one example embodiment of the technology.

FIG. 11 schematically illustrates an example of a cross-sectional configuration of a main portion of a semiconductor device, i.e., a semiconductor device 10, according to a second example embodiment of the technology. FIG. 11 corresponds to FIG. 1 illustrating the semiconductor device 1. The semiconductor device 10 may include a conductive auxiliary film 19 in place of a conductive film, i.e., the conductive film 12 illustrated in FIG. 1. In other respects, the semiconductor device 10 may have a configuration similar to that of the semiconductor device 1 according to the foregoing example embodiment, and their workings and effects may also be similar.

The conductive auxiliary film 19 may be provided selectively in contact with the low-resistance regions 13c of the semiconductor film 13. The conductive auxiliary film 19 may be provided, for example, between the substrate 11 and the semiconductor film 13 and may be in contact with a lower surface of the semiconductor film 13. As the conductive auxiliary film 19 is in contact with the low-resistance regions 13c, the conductive auxiliary film 19 may play a role of reducing the resistance of the low-resistance regions 13c of the semiconductor film 13.

For example, the conductive auxiliary film 19 may be formed by a hydrogen-containing film containing hydrogen (H) at a high concentration. In a specific but non-limiting example, the conductive auxiliary film 19 may be formed by, for example but not limited to, a silicon nitride (SiN) film containing hydrogen at a high concentration. The silicon nitride film may be formed through a CVD technique, for example.

Figure 12A:
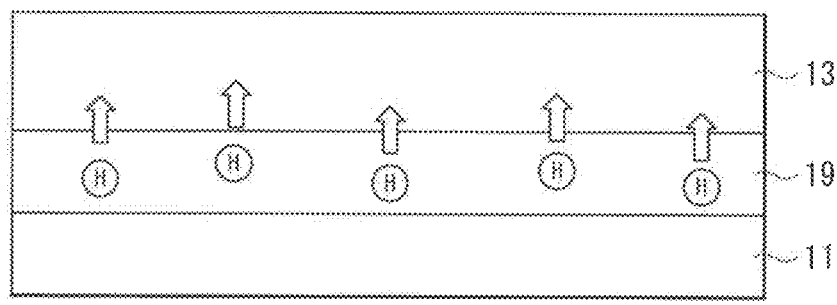
FIG. 12A is a cross-sectional schematic diagram for describing an example of a working of a conductive auxiliary film illustrated in FIG. 11.
Figure 12B:
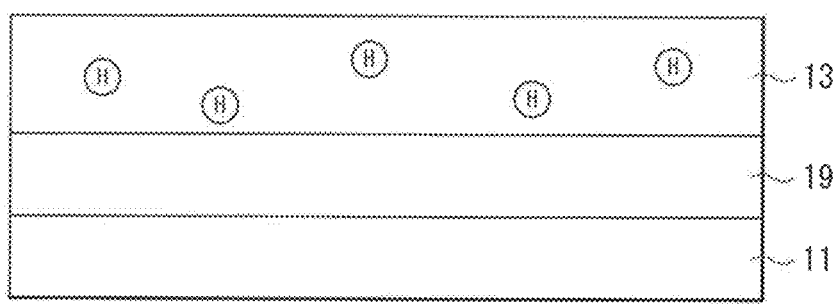
FIG. 12B is a cross-sectional schematic diagram illustrating an example of a process that follows the process illustrated in FIG. 12A.

FIGS. 12A and 12B illustrate an example of a mechanism through which the conductive auxiliary film 19 formed by a hydrogen-containing film reduces the resistance of the semiconductor film 13. When the conductive auxiliary film 19 containing hydrogen is heated through, for example but not limited to, an annealing treatment, the hydrogen may be diffused into the semiconductor film 13 from the conductive auxiliary film 19, as illustrated in FIG. 12A. The hydrogen incorporated into the semiconductor film 13 may act as an electron donor, as illustrated in FIG. 12B, and thus the resistance of the semiconductor film 13 may be reduced.

Figure 12C:
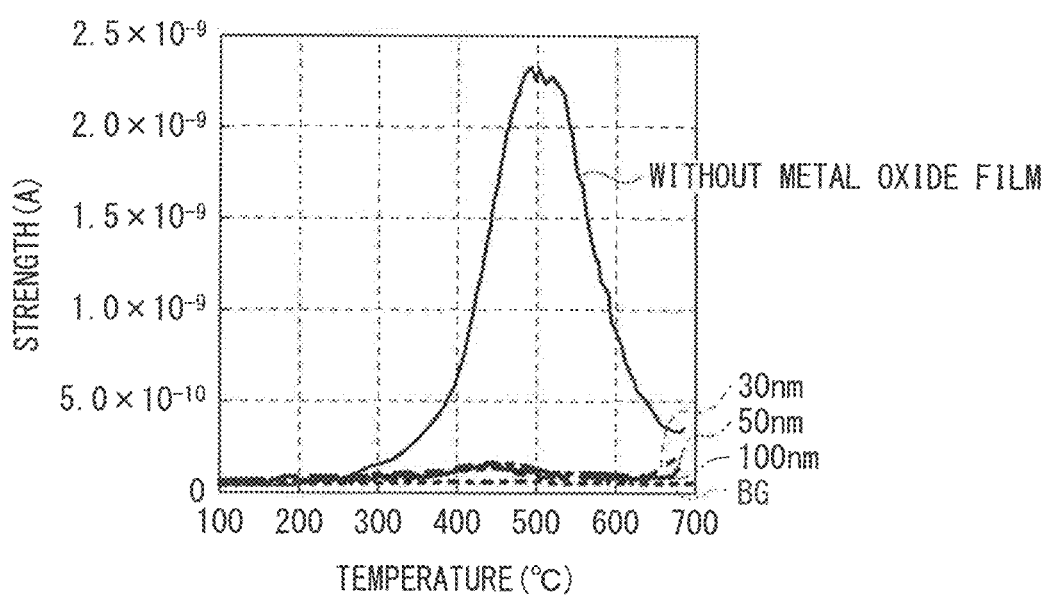
FIG. 12C illustrates a result of thermal desorption spectroscopy-mass spectrometry.

FIG. 12C illustrates a result of investigating an influence of the metal oxide film 16 through thermal desorption spectroscopy-mass spectrometry (TDS-MS). It has been found that, providing the metal oxide film 16 having a thickness of 30 nm to 100 nm over the conductive auxiliary film 19 formed by a hydrogen-containing film may help suppress desorption of hydrogen from the conductive auxiliary film 19 caused by heating through, for example but not limited to, an annealing treatment. Accordingly, the presence of the metal oxide film 16 may suppress a change in the carrier concentration in the intermediate regions 13b and the low-resistance regions 13c of the semiconductor film 13, that is, a change in the resistance that could result from desorption of hydrogen from the conductive auxiliary film 19.

Furthermore, the conductive auxiliary film 19 may contain a reactive metal, such as aluminum (Al). In this example, a reactive metal may be a reactive metal whose oxide has Gibbs free energy lower than the Gibbs free energy of an oxide of each metallic element included in the semiconductor film 13. For example, when the semiconductor film 13 includes indium (In), gallium (Ga), and zinc (Zn), the Gibbs free energy of an oxide of aluminum may be lower than the Gibbs free energy of an oxide of the above metals. For example, the conductive auxiliary film 19 may be formed by, for example but not limited to, an aluminum film or an aluminum alloy film. Examples of the aluminum alloy film may include an aluminum silicon (AlSi) film.

Figure 13A:
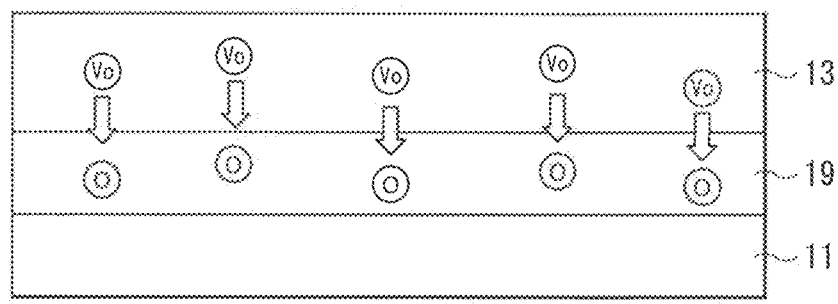
FIG. 13A is a cross-sectional schematic diagram for describing another example of a working of a conductive auxiliary film illustrated in FIG. 11.
Figure 13B:
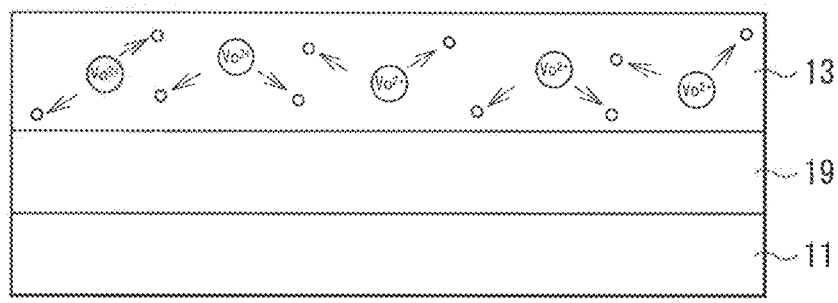
FIG. 13B is a cross-sectional schematic diagram illustrating an example of a process that follows the process illustrated in FIG. 13A.

FIGS. 13A and 13B illustrate an example of a mechanism through which the conductive auxiliary film 19 formed by a reactive metal film reduces the resistance of the semiconductor film 13. When the semiconductor film 13 is heated through, for example but not limited to, an annealing treatment, oxygen may be extracted from the semiconductor film 13 into the conductive auxiliary film 19, and an oxygen vacancy Vo may be formed in the semiconductor film 13, as illustrated in FIG. 13A. In the semiconductor film 13, an electron may be supplied as a carrier from the oxygen vacancy Vo, as illustrated in FIG. 13B, and thus the resistance of the semiconductor film 13 may be reduced.

The semiconductor film 13 provided on the conductive auxiliary film 19 may include the channel region 13a opposed to the gate electrode 15, the low-resistance regions 13c that are in contact with the conductive auxiliary film 19, and the intermediate regions 13b between the channel region 13a and the respective low-resistance regions 13c. In this example, the carrier concentrations in the channel region 13a, the intermediate regions 13b, and the low-resistance regions 13c of the semiconductor film 13 may satisfy the following Expression 1:

$$C1 < C2 < C3 \quad \text{Expression 1}$$

where

C1 denotes the carrier concentration in the channel region 13a of the semiconductor film 13, C2 denotes the carrier concentration in the intermediate regions 13b of the semiconductor film 13, and C3 denotes the carrier concentration in the low-resistance regions 13c of the semiconductor film 13.

Accordingly, the carrier concentration in the intermediate regions 13b of the semiconductor film 13 may be adjusted to satisfy Expression 1.

For example, the carrier concentration in the channel region 13a of the semiconductor film 13 may be no higher than $1 \times 10^{17}$ cm$^{-3}$, the carrier concentration in the intermediate regions 13b of the semiconductor film 13 may be no lower than $1 \times 10^{18}$ cm$^{-3}$ nor higher than $1.4 \times 10^{20}$ cm$^{-3}$, and the carrier concentration in the low-resistance regions 13c of the semiconductor film 13 may be higher than $1.4 \times 10^{20}$ cm$^{-3}$. In this example, since the carrier concentration in the intermediate regions 13b of the semiconductor film 13 is lower than the carrier concentration in the low-resistance regions 13c of the semiconductor film 13, it is possible to reduce the diffusion length dL, as compared to that in the semiconductor device 100 illustrated in FIGS. 6 and 7. Accordingly, in the semiconductor device 10 as well, it is possible to suppress a shift in the threshold voltage Vth and to maintain the characteristics stably.

Furthermore, in the semiconductor device 10, it may be possible to set the carrier concentration in the low-resistance regions 13c of the semiconductor film 13 that serve as a wire and the carrier concentration in the intermediate regions 13b of the semiconductor film 13 independently from each other. This makes it possible to increase the conductivity of the low-resistance regions 13c by increasing the carrier concentration in the low-resistance regions 13c of the semiconductor film 13 and to reduce the diffusion length dL by reducing the carrier concentration in the intermediate regions 13b of the semiconductor film 13.

Such a semiconductor device 10 may be manufactured in a manner similar to how the semiconductor device 1 is manufactured.

In the semiconductor device 10, the intermediate regions 13b may be provided between the channel region 13a and the respective low-resistance regions 13c of the semiconductor film 13, and the carrier concentration in the intermediate regions 13b of the semiconductor film 13 may satisfy Expression 1. This makes it possible to reduce the diffusion length for an oxygen vacancy donor to be diffused into the channel region 13a from the intermediate regions 13b. Accordingly, it is possible to suppress a variation in the characteristics, such as the threshold voltage Vth, associated with the channel length.

3. Modification Example 1

Figure 14:
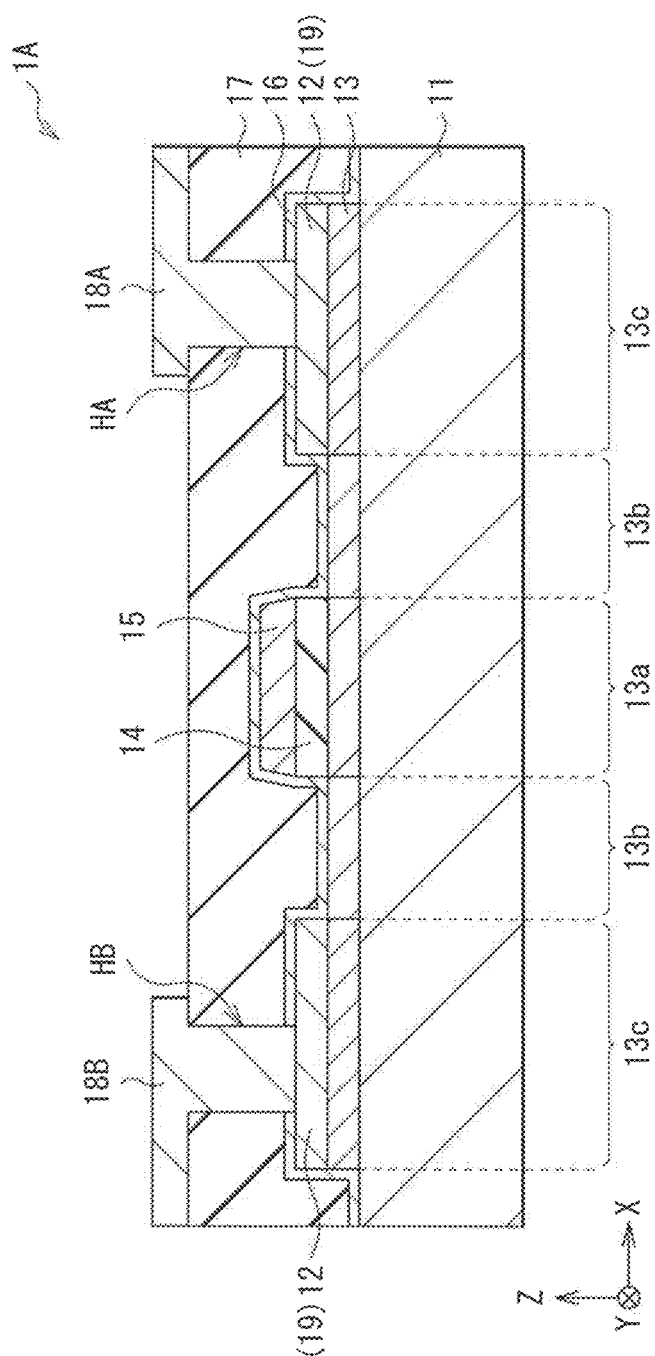
FIG. 14 is a cross-sectional schematic diagram illustrating an example of a configuration of a main portion of a semiconductor device according to one modification example.

FIG. 14 schematically illustrates an example of a cross-sectional configuration of a main portion of a semiconductor device, i.e., a semiconductor device 1A, according to Modification Example 1 of the first and second example embodiments described above. FIG. 14 corresponds to FIG. 1 illustrating the semiconductor device 1 and FIG. 11 illustrating the semiconductor device 10. In the semiconductor device 1A, the conductive film 12 or the conductive auxiliary film 19 may be in contact with an upper surface of the semiconductor film 13, i.e., the surface opposite to the surface facing the substrate 11. In other respects, the semiconductor device 1A according to Modification Example 1 may have a configuration similar to that of the semiconductor device 1 or the semiconductor device 10 according to the foregoing example embodiments, and their workings and effects may also be similar.

In the semiconductor device 1A, the semiconductor film 13 and the conductive film 12 or the conductive auxiliary film 19 may be provided in this order over the substrate 11, and the conductive film 12 may be selectively in contact with the low-resistance regions 13c of the semiconductor film 13. In other words, the semiconductor film 13 may be provided between the substrate 11 and the conductive film 12. In such a semiconductor device 1A, since the conductive film 12 is provided on the semiconductor film 13, an occurrence of a stepped discontinuity in the semiconductor film 13 caused by the conductive film 12 may be suppressed. Accordingly, as compared with the semiconductor device 1 in which the semiconductor film 13 is provided on the conductive film 12, a deterioration of the characteristics associated with a stepped discontinuity in the semiconductor film 13 may be suppressed.

FIGS. 15A to 15D illustrate an example of processes of manufacturing the semiconductor device 1A in sequence.

Figure 15A:
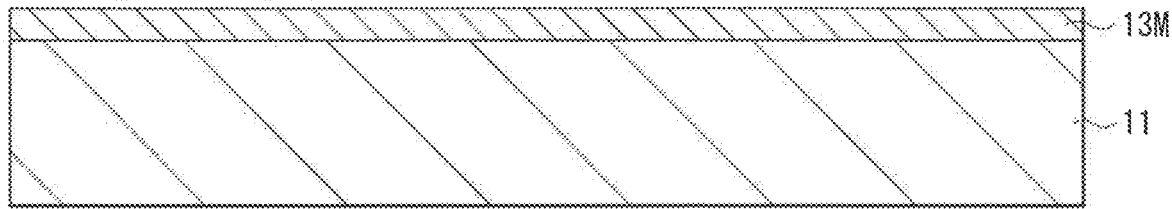
FIG. 15A is a cross-sectional schematic diagram illustrating an example of one process in a method of manufacturing the semiconductor device illustrated in FIG. 11.
Figure 15B:
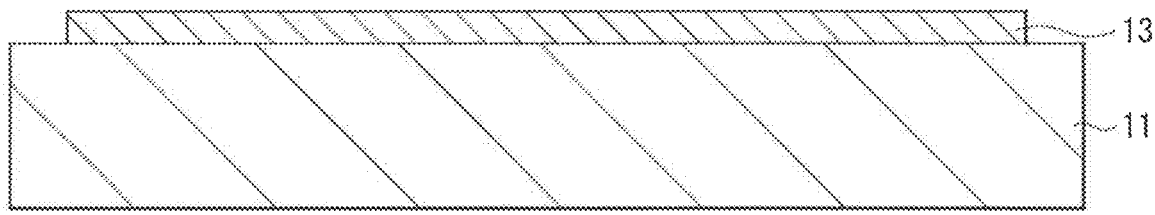
FIG. 15B is a cross-sectional schematic diagram illustrating an example of a process that follows the process illustrated in FIG. 15A.
Figure 15C:
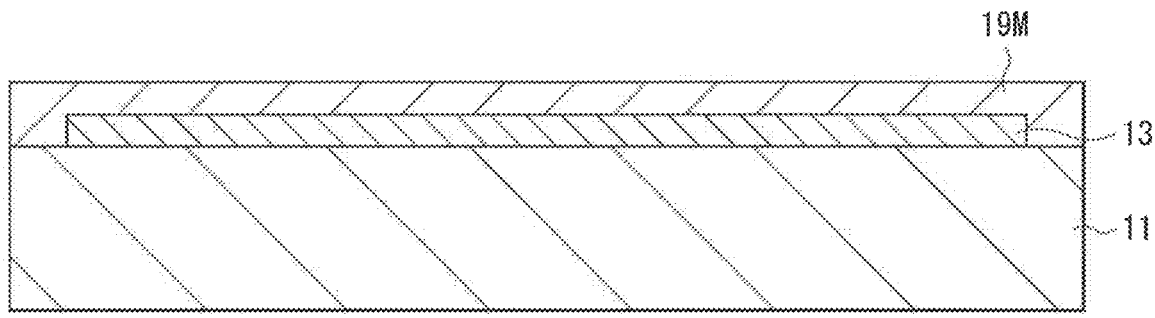
FIG. 15C is a cross-sectional schematic diagram illustrating an example of a process that follows the process illustrated in FIG. 15B.
Figure 15D:
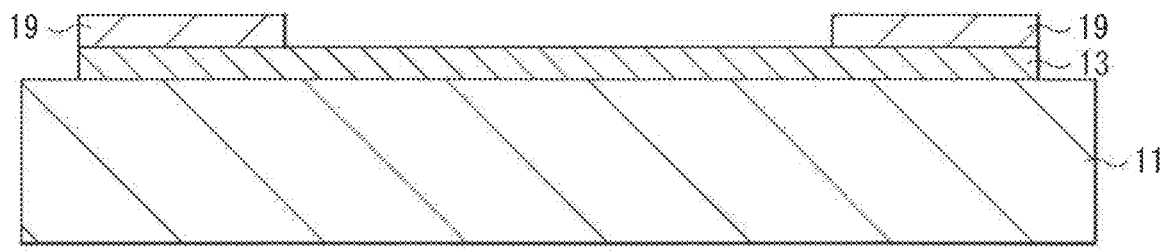
FIG. 15D is a cross-sectional schematic diagram illustrating an example of a process that follows the process illustrated in FIG. 15C.

First, as illustrated in FIGS. 15A and 15B, the semiconductor material film 13M may be formed on the substrate 11 with an oxide semiconductor material, and thereafter the semiconductor material film 13M may be patterned to form the semiconductor film 13 in a selective region on the substrate 11. Thereafter, as illustrated in FIG. 15C, a conductive filler material film 19M or the conductive material film 12M may be formed over an entire surface of the substrate 11. The conductive auxiliary film 19 may be formed from the conductive filler material film 19M in a later process. The conductive filler material film 19M may be formed of, for example but not limited to, AlSi. In one example embodiment, a material having an etching selectivity with respect to the material of the semiconductor film 13 may be used for the conductive filler material film 19M or the conductive material film 12M. After the conductive filler material film 19M has been formed, as illustrated in FIG. 15D, the conductive filler material film 19M may be patterned to form the conductive auxiliary film 19. Thereafter, as illustrated in FIG. 5F, the insulating film 14M may be formed over an entire surface of the substrate 11 to cover the conductive auxiliary film 19 and the semiconductor film 13. The carrier concentration in the intermediate regions 13b of the semiconductor film 13 may be adjusted to no lower than $1\times10^{18}$ cm$^{-3}$ nor higher than $1.4\times10^{20}$ cm$^{-3}$ through a deposition condition held when the insulating film 14M is formed. Thereafter, as illustrated in FIG. 5G, the electrode film 15M may be formed on the insulating film 14M. Thereafter, the semiconductor device 1A may be manufactured in a manner similar to the manner described above in the first example embodiment.

As in the semiconductor devices 1 and 10, in the semiconductor device 1A according to Modification Example 1, the intermediate regions 13b may be provided between the channel region 13a and the respective low-resistance regions 13c of the semiconductor film 13. This makes it possible to reduce the diffusion length for an oxygen vacancy donor to be diffused into the channel region 13a from the intermediate regions 13b. Accordingly, it is possible to suppress a variation in the characteristics, such as the threshold voltage Vth, associated with the channel length.

4. Modification Example 2

Figure 16:
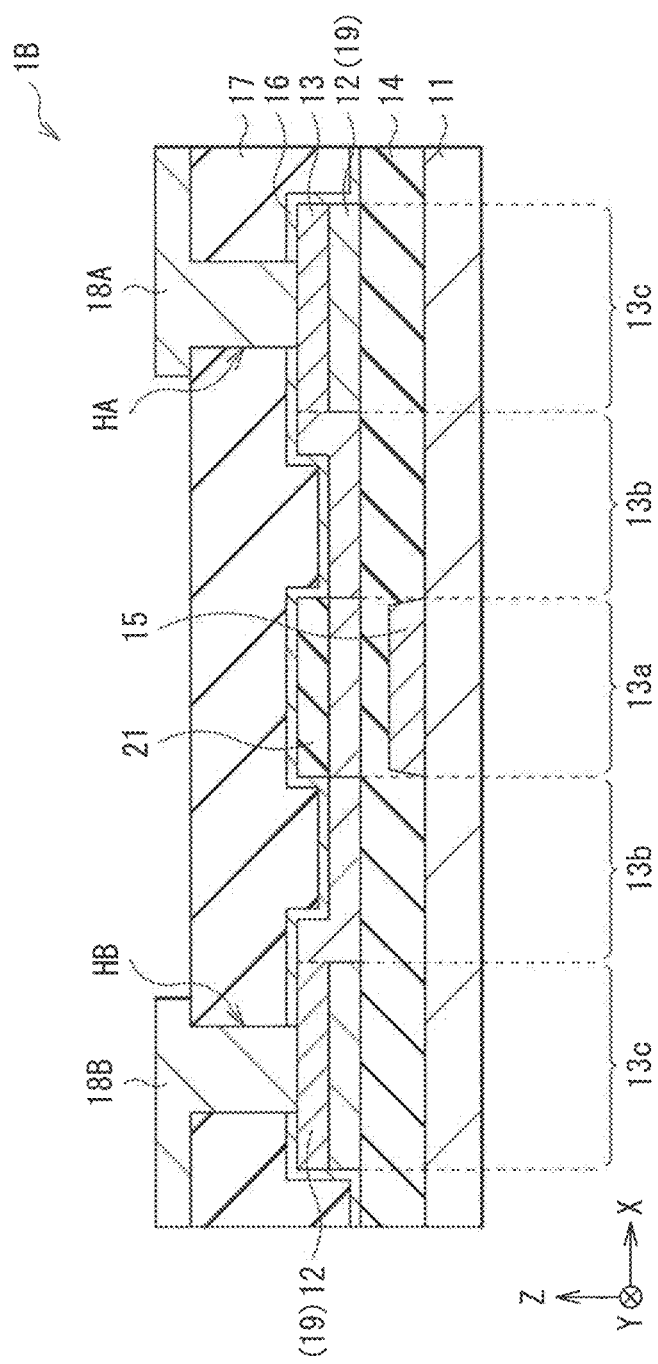
FIG. 16 is a cross-sectional schematic diagram illustrating an example of a configuration of a main portion of a semiconductor device according to one modification example.

FIG. 16 schematically illustrates an example of a cross-sectional configuration of a main portion of a semiconductor device, i.e., a semiconductor device 1B, according to Modification Example 2 of the first and second example embodiments described above. FIG. 16 corresponds to FIG. 1 illustrating the semiconductor device 1 and FIG. 11 illustrating the semiconductor device 10. The semiconductor device 1B may include a thin film transistor of a bottom gate type. In other respects, the semiconductor device 1B according to Modification Example 2 may have a configuration similar to that of the semiconductor device 1 or the semiconductor device 10 according to the foregoing example embodiments, and their workings and effects may also be similar.

In the semiconductor device 1B, the gate electrode 15, the gate insulating film 14, the conductive film 12 or the conductive auxiliary film 19, the semiconductor film 13, a channel protection film 21, the metal oxide film 16, the interlayer insulating film 17, and the source-drain electrodes 18A and 18B may be provided in this order over the substrate 11. FIG. 16 illustrates a case where the conductive film 12 is in contact with the lower surface of the semiconductor film 13. Alternatively, the conductive film 12 may be in contact with the upper surface of the semiconductor film 13, as in the case described above in Modification Example 1.

The channel protection film 21 may selectively cover the channel region 13a of the semiconductor film 13. The channel protection film 21 may serve to form the intermediate regions 13b and the low-resistance regions 13c of a self-aligned structure in the semiconductor film 13. For the channel protection film 21, an inorganic insulating material, such as a silicon oxide film (SiO), a silicon nitride film (SiN), a silicon oxynitride film (SiON), or an aluminum oxide film (AlO), may be used, for example.

FIGS. 17A to 17F illustrate an example of processes of manufacturing the semiconductor device 1B in sequence.

Figure 17A:
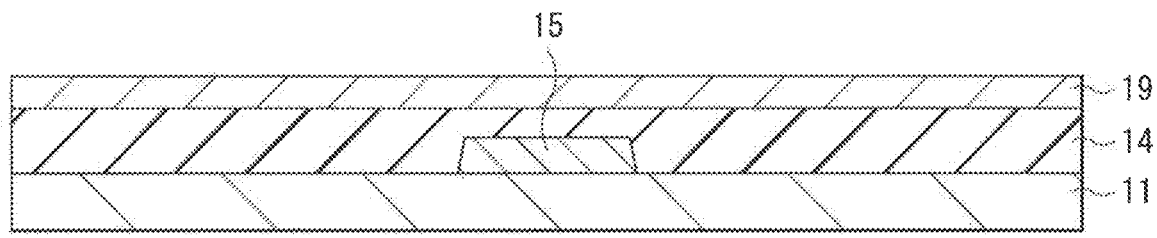
FIG. 17A is a cross-sectional schematic diagram illustrating an example of one process in a method of manufacturing the semiconductor device illustrated in FIG. 16.

First, as illustrated in FIG. 17A, the gate electrode 15, the gate insulating film 14, and the conductive filler material film 19M or the conductive material film 12M may be formed in this order over the substrate 11. In this example, the gate insulating film 14 may be formed before the semiconductor material film 13M illustrated in FIG. 17C is formed, and this makes it possible to form the gate insulating film 14 at a relatively high temperature. When the gate insulating film 14 or the insulating film 14M is formed after the semiconductor material film 13M has been formed, forming the gate insulating film 14 at a high temperature may cause the semiconductor material film 13M to deteriorate. The gate insulating film 14 formed at a high temperature may yield a good interface with the semiconductor film 13. Accordingly, in the semiconductor device 1B, a good interface between the gate insulating film 14 and the semiconductor film 13 makes it possible to improve the characteristics.

Figure 17B:
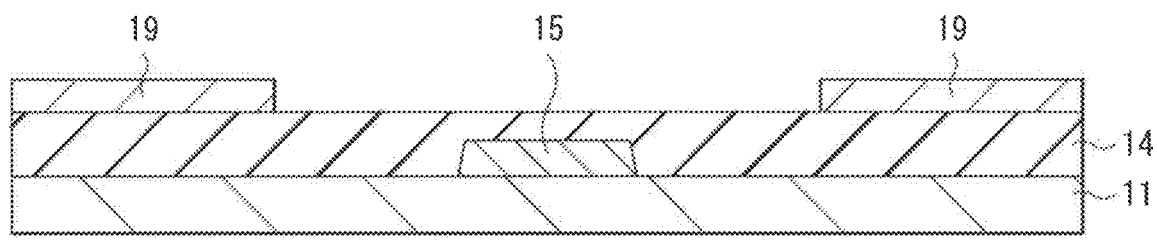
FIG. 17B is a cross-sectional schematic diagram illustrating an example of a process that follows the process illustrated in FIG. 17A.
Figure 17C:
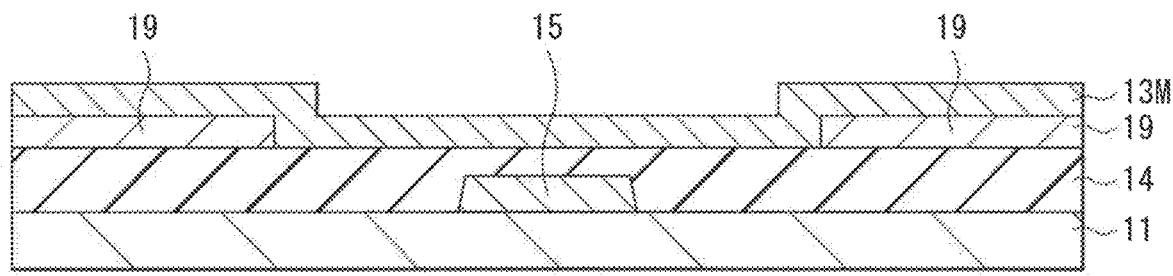
FIG. 17C is a cross-sectional schematic diagram illustrating an example of a process that follows the process illustrated in FIG. 17B.

After the conductive filler material film 19M has been formed, as illustrated in FIG. 17B, the conductive filler material film 19M may be patterned to form the conductive auxiliary film 19. The conductive auxiliary film 19 may be formed in a selective region on the gate insulating film 14. The conductive auxiliary film 19 may be formed at a position that does not overlap the gate electrode 15 as viewed in a plan view.

Figure 17D:
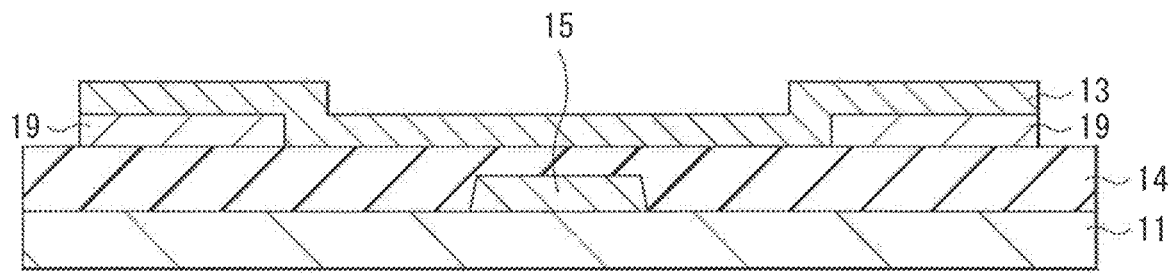
FIG. 17D is a cross-sectional schematic diagram illustrating an example of a process that follows the process illustrated in FIG. 17C.

After the conductive auxiliary film 19 has been formed, as illustrated in FIG. 17C, the semiconductor material film 13M may be formed over an entire surface of the substrate 11 to cover the conductive auxiliary film 19. Thereafter, as illustrated in FIG. 17D, the semiconductor material film 13M may be patterned to form the semiconductor film 13.

Figure 17E:
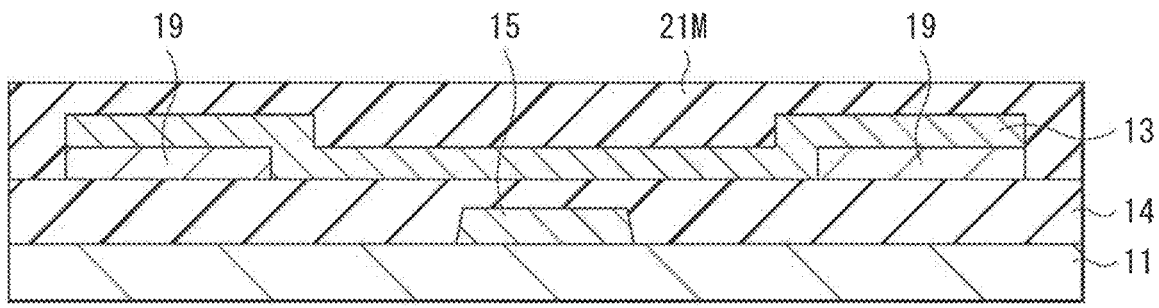
FIG. 17E is a cross-sectional schematic diagram illustrating an example of a process that follows the process illustrated in FIG. 17D.

Thereafter, as illustrated in FIG. 17E, a channel protection material film 21M may be formed over an entire surface of the substrate 11 to cover the semiconductor film 13. The channel protection film 21 may be formed from the channel protection material film 21M in a later process. The carrier concentration in the intermediate regions 13b of the semiconductor film 13 may be adjusted to no lower than $1\times10^{18}$ cm$^{-3}$ nor higher than $1.4\times10^{20}$ cm$^{-3}$ through a deposition condition held when the channel protection material film 21M is formed.

Figure 17F:
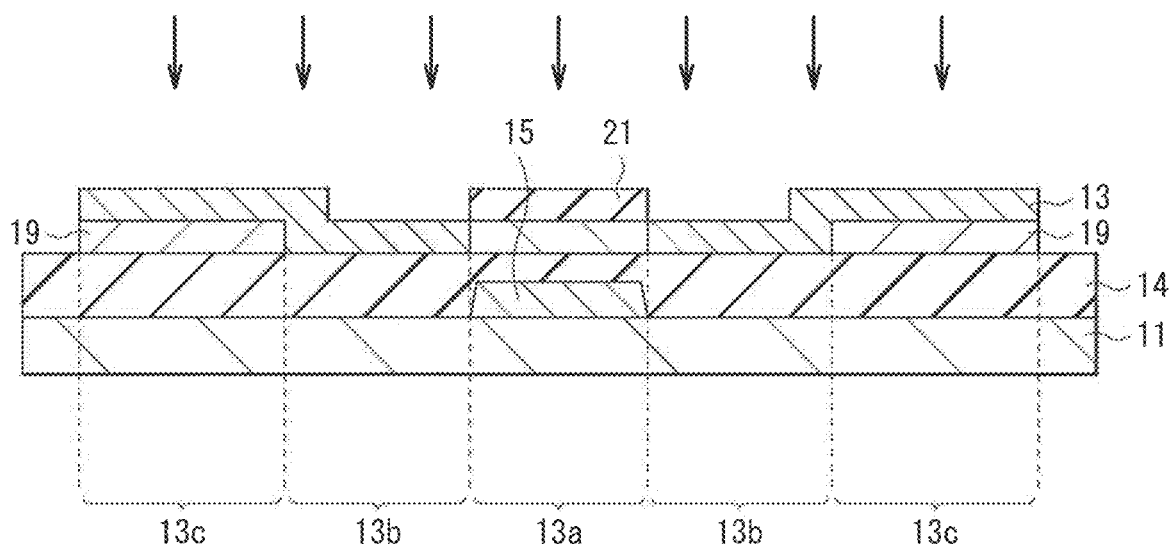
FIG. 17F is a cross-sectional schematic diagram illustrating an example of a process that follows the process illustrated in FIG. 17E.

After the channel protection material film 21M has been formed, as illustrated in FIG. 17F, the channel protection material film 21M may be patterned to form the channel protection film 21 in a selective region on the semiconductor film 13, i.e., the channel region 13a. The patterning may be performed through photolithography and dry etching, for example. The carrier concentration in the intermediate regions 13b of the semiconductor film 13 may be adjusted to no lower than $1\times10^{18}$ cm$^{-3}$ nor higher than $1.4\times10^{20}$ cm$^{-3}$ through the dry etching. Alternatively, the intermediate regions 13b of the semiconductor film 13 may be subjected to a plasma treatment or an ion implantation thereafter, and the carrier concentration in the intermediate regions 13b of the semiconductor film 13 may be adjusted to no lower than $1\times10^{18}$ cm$^{-3}$ nor higher than $1.4\times10^{20}$ cm$^{-3}$. Thereafter, the semiconductor device 1B may be manufactured in a manner similar to the manner described above in the first example embodiment.

As in the semiconductor devices 1 and 10, in the semiconductor device 1B according to Modification Example 2, the intermediate regions 13b may be provided between the channel region 13a and the respective low-resistance regions 13c of the semiconductor film 13. This makes it possible to reduce the diffusion length for an oxygen vacancy donor to be diffused into the channel region 13a from the intermediate regions 13b. Accordingly, it is possible to suppress a variation in the characteristics, such as the threshold voltage Vth, associated with the channel length.

5. Application Example 1: Display Apparatus and Imaging Apparatus

The semiconductor devices 1, 10, 1A, and 1B described in the foregoing example embodiments and modification examples may be used in a driving circuit of, for example but not limited to, a display apparatus, i.e., a display apparatus 2A illustrated in FIG. 18 described later, or an imaging apparatus, i.e., an imaging apparatus 2B illustrated in FIG. 19 described later, for example.

Figure 18:
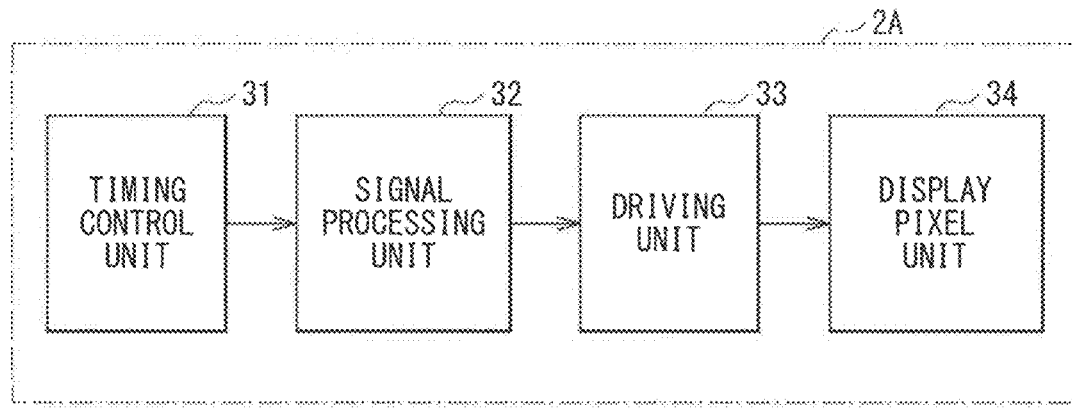
FIG. 18 is a block diagram illustrating an example configuration of a display apparatus to which the semiconductor device illustrated in FIG. 1 and so on is applied.

FIG. 18 is a block diagram illustrating an example configuration of the display apparatus 2A. The display apparatus 2A may display, in the form of a video, a video signal input from the outside or an internally generated video signal, and the display apparatus 2A may apply to, for example but not limited to, an organic electroluminescent (EL) display and a liquid crystal display. The display apparatus 2A may include a timing control unit 31, a signal processing unit 32, a driving unit 33, and a display pixel unit 34, for example.

The timing control unit 31 may include a timing generator that generates various timing signals, i.e., control signals. The timing control unit 31 may control driving of, for example but not limited to, the signal processing unit 32 in accordance with the various timing signals. The signal processing unit 32 may perform a predetermined correction on a digital video signal input from the outside and output a video signal obtained through the predetermined correction to the driving unit 33, for example. The driving unit 33 may include, for example but not limited to, a scanning line driving circuit and a signal line driving circuit. The driving unit 33 may drive each pixel in the display pixel unit 34 via various control lines. The display pixel unit 34 may include a display element, such as an organic EL element or a liquid crystal display element, and a pixel circuit for driving the display element on a pixel-by-pixel basis, for example. The semiconductor device described above may be used in various circuits forming, of the above units, a portion of the driving unit 33 or the display pixel unit 34, for example.

Figure 19:
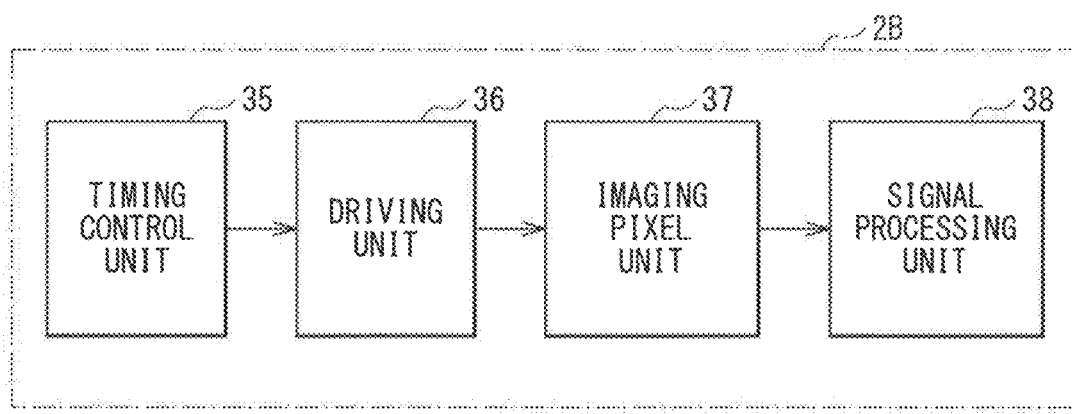
FIG. 19 is a block diagram illustrating an example of a configuration of an imaging apparatus to which the semiconductor device illustrated in FIG. 1 and so on is applied.

FIG. 19 is a block diagram illustrating an example configuration of the imaging apparatus 2B. The imaging apparatus 2B may be a solid state imaging apparatus that acquires an image in the form of an electric signal, for example. The imaging apparatus 2B may include, for example but not limited to, a charge coupled device (CCD) or complementary metal oxide semiconductor (CMOS) image sensor. The imaging apparatus 2B may include a timing control unit 35, a driving unit 36, an imaging pixel unit 37, and a signal processing unit 38, for example.

The timing control unit 35 may include a timing generator that generates various timing signals, i.e., control signals. The timing control unit 35 may control driving of the driving unit 36 in accordance with the various timing signals. The driving unit 36 may include, for example but not limited to, a row selecting circuit, an analog-to-digital (AD) conversion circuit, and a horizontal transfer scanning circuit. The driving unit 36 may perform driving of reading out a signal from each pixel in the imaging pixel unit 37 via various control lines. The imaging pixel unit 37 may include an imaging element, i.e., a photoelectric conversion element, such as a photodiode, and a pixel circuit for reading out a signal, for example. The signal processing unit 38 may perform various types of signal processing on a signal obtained from the imaging pixel unit 37. The semiconductor device described above may be used in various circuits forming, of the above units, a portion of the driving unit 36 or the imaging pixel unit 37, for example.

6. Application Example 2: Electronic Equipment

Figure 20:
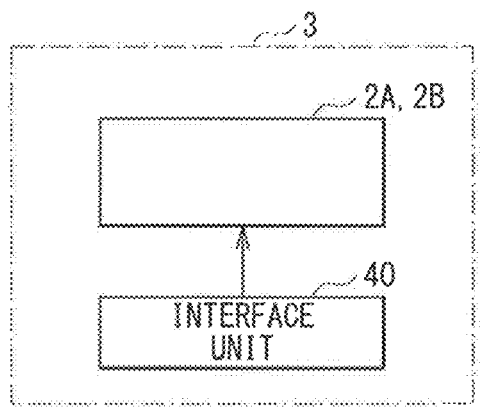
FIG. 20 is a block diagram illustrating an example of a configuration of electronic equipment.

The display apparatus 2A and the imaging apparatus 2B described above, for example, may be used in various types of electronic equipment. FIG. 20 is a block diagram illustrating an example configuration of electronic equipment 3. Example of the electronic equipment 3 may include a television set, a personal computer (PC), a smartphone, a tablet PC, a mobile phone, a digital still camera, and a digital video camera.

The electronic equipment 3 may include the display apparatus 2A or the imaging apparatus 2B described above and an interface unit 40, for example. The interface unit 40 may be an input unit to which, for example but not limited to, various signals and a power source are input from the outside. The interface unit 40 may further include a user interface, such as a touch panel, a keyboard, or an operation button, for example.

Thus far, the technology has been described with reference to some example embodiments and modification examples. The technology, however, is not limited to these example embodiments and modification examples, and various other alterations are possible. For example, the material and the thickness of each layer described in the foregoing example embodiments and modification examples are not limited to those stated above, and each layer may be made of another material and may have a different thickness.

Figure 21:
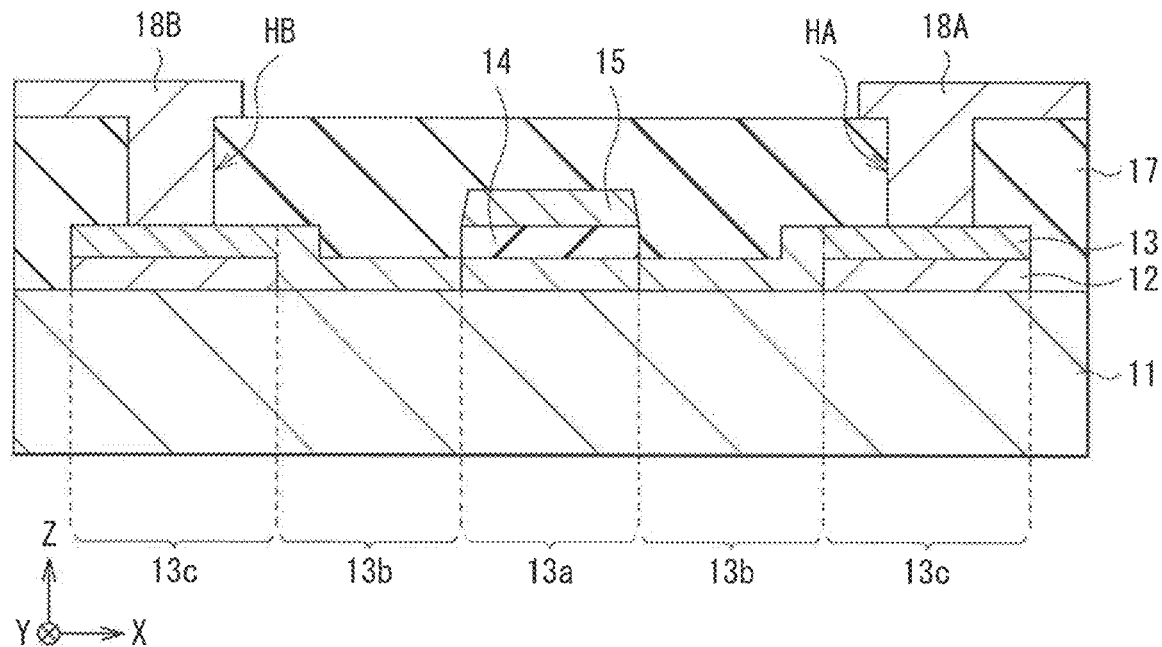

Furthermore, in the cases described in the foregoing example embodiments and modification examples, the semiconductor devices 1, 10, 1A, and 1B may each have the metal oxide film 16 that is in contact with the intermediate regions 13b and the low-resistance regions 13c of the semiconductor film 13, as illustrated in FIG. 1 and so on. Alternatively, as illustrated in FIG. 21, the metal oxide film 16 may not be provided in the semiconductor devices 1, 10, 1A, and 1B.

Figure 22:
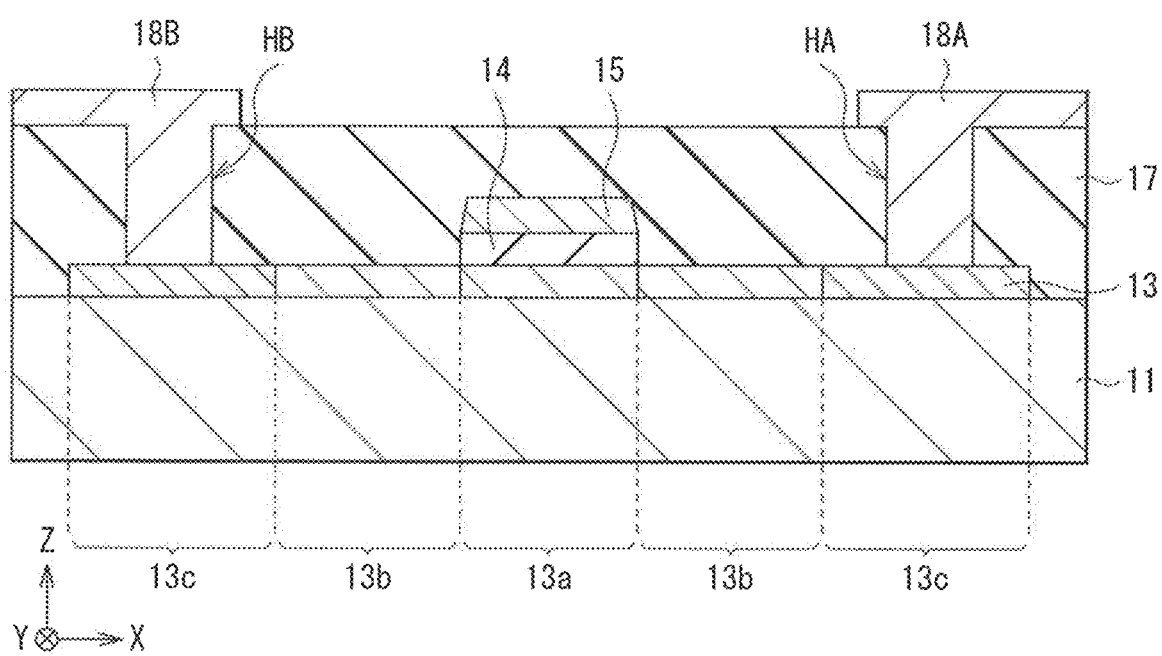

Furthermore, in the cases described in the foregoing example embodiments and modification examples, the semiconductor devices 1, 10, 1A, and 1B may each include the conductive film 12 or the conductive auxiliary film 19 that is in contact with the low-resistance regions 13c of the semiconductor film 13. Alternatively, as illustrated in FIG. 22, neither the conductive film 12 nor the conductive auxiliary film 19 may be provided in the semiconductor devices 1, 10, 1A, and 1B.

The effects described in the foregoing example embodiments and modification examples are merely examples, and the effects of the technology may be different from those described above or may include another effect.

The technology may also have the following configurations.

(1) A semiconductor device including:
a gate electrode;
a semiconductor film including an oxide semiconductor material, the semiconductor film including a channel region opposed to the gate electrode, a low-resistance region having a lower electric resistance than the channel region, and an intermediate region between the low-resistance region and the channel region; and
a conductive film provided selectively in contact with the low-resistance region of the semiconductor film.

(2) The semiconductor device according to (1), in which the conductive film includes an oxide.

(3) The semiconductor device according to (2), in which
the semiconductor film includes a metal, and
the conductive film includes the metal that is same as the metal included in the semiconductor film.

(4) The semiconductor device according to any one of (1) to (3), further including:
a substrate: and
a gate insulating film between the gate electrode and the semiconductor film, in which
the semiconductor film, the gate insulating film, and the gate electrode are provided in this order over the substrate.

(5) The semiconductor device according to (4), in which the gate electrode and the gate insulating film have an identical planar shape.

(6) The semiconductor device according to any one (1) to (3), further including:
a substrate; and
a gate insulating film between the gate electrode and the semiconductor film, in which
the gate electrode, the gate insulating film, and the semiconductor film are provided in this order over the substrate.

(7) The semiconductor device according to (4) or (5), in which the conductive film is provided between the substrate and the semiconductor film.

(8) The semiconductor device according to (4) or (5), in which the semiconductor film is provided between the substrate and the conductive film.

(9) A semiconductor device including:
a gate electrode;
a semiconductor film including an oxide semiconductor material, the semiconductor film including a channel region opposed to the gate electrode, a low-resistance region having a lower electric resistance than the channel region, and an intermediate region provided between the low-resistance region and the channel region and having a carrier concentration satisfying the following Expression 1:

$$C1 < C2 < C3 \qquad \text{Expression 1}$$

where
C1 denotes the carrier concentration in the channel region of the semiconductor film,
C2 denotes the carrier concentration in the intermediate region of the semiconductor film, and
C3 denotes the carrier concentration in the low-resistance region of the semiconductor film; and
a conductive auxiliary film provided selectively in contact with the low-resistance region of the semiconductor film, the conductive auxiliary film reducing a resistance of the semiconductor film.

(10) The semiconductor device according to (9), in which the conductive auxiliary film includes aluminum.

(11) The semiconductor device according to (9), in which the conductive auxiliary film include a hydrogen-containing film.

(12) The semiconductor device according to any one of (9) to (11), in which the carrier concentration C2 in the intermediate region of the semiconductor film is no higher than $1.4 \times 10^{20}$ cm$^{-3}$.

(13) The semiconductor device according to any one of (9) to (12), further including:
a substrate; and
a gate insulating film between the gate electrode and the semiconductor film, in which
the semiconductor film, the gate insulating film, and the gate electrode are provided in this order over the substrate.

(14) The semiconductor device according to any one of (9) to (12), further including:
a substrate; and
a gate insulating film between the gate electrode and the semiconductor film, in which
the gate electrode, the gate insulating film, and the semiconductor film are provided in this order over the substrate.

(15) The semiconductor device according to (13), in which the conductive auxiliary film is provided between the substrate and the semiconductor film.

(16) The semiconductor device according to (13), in which the semiconductor film is provided between the substrate and the conductive auxiliary film.

(17) The semiconductor device according to any one of (1) to (16), in which the intermediate region has a dimension of no less than 1 μm nor more than 3 μm in a channel length direction.

(18) The semiconductor device according to any one of (1) to (17), further including a metal oxide film that is in contact with at least the intermediate region of the semiconductor film.

(19) A display apparatus including a display element and a semiconductor device that drives the display element, the semiconductor device including:
a gate electrode;
a semiconductor film including an oxide semiconductor material, the semiconductor film including a channel region opposed to the gate electrode, a low-resistance region having a lower electric resistance than the channel region, and an intermediate region between the low-resistance region and the channel region; and
a conductive film provided selectively in contact with the low-resistance region of the semiconductor film.

(20) A display apparatus including a display element and a semiconductor device that drives the display element, the semiconductor device including:
a gate electrode;
a semiconductor film including an oxide semiconductor material; the semiconductor film including a channel region opposed to the gate electrode, a low-resistance region having a lower electric resistance than the channel region, and an intermediate region provided between the low-resistance region and the channel region and having a carrier concentration satisfying the following Expression 1:

$$C1 < C2 < C3 \qquad \text{Expression 1}$$

where
C1 denotes the carrier concentration in the channel region of the semiconductor film.
C2 denotes the carrier concentration in the intermediate region of the semiconductor film, and C3 denotes the carrier concentration in the low-resistance region of the semiconductor film; and a conductive auxiliary film provided selectively in contact with the low-resistance region of the semiconductor film, the conductive auxiliary film reducing a resistance of the semiconductor film.

In the semiconductor device and the display apparatus according to one embodiment of the technology, the intermediate region is provided between the channel region and the low-resistance region of the semiconductor film, and this makes it possible to adjust the carrier concentration in the intermediate region of the semiconductor film.

In the semiconductor device and the display apparatus according to one embodiment of the technology, the intermediate region is provided between the channel region and the low-resistance region of the semiconductor film, and this makes it possible to adjust the carrier concentration in the intermediate region to satisfy Expression 1.

With the semiconductor device and the display apparatus according to some embodiments of the technology, since the intermediate region is provided between the channel region and the low-resistance region of the semiconductor film, it is possible to freely adjust the carrier concentration in the intermediate region of the semiconductor film. This makes it possible to reduce the diffusion length for an oxygen vacancy donor to be diffused into the channel region from the intermediate region. Accordingly, it is possible to suppress a variation in the characteristics, such as a threshold voltage Vth, associated with the channel length. It is to be noted that the effects described in this section are not necessarily limiting, and the effects of the technology may be any effect described in the specification.

Although the technology has been described in terms of example embodiments and modification examples, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. The term "disposed on/provided on/formed on" and its variants as used herein refer to elements disposed directly in contact with each other or indirectly by having intervening structures therebetween. Moreover, no element or component in this technology is intended to be dedicated to the public regardless of whether the element or component is explicitly recited in the following claims.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
    a substrate;
    a gate electrode over the substrate;
    a semiconductor film including an oxide semiconductor material, the semiconductor film including a channel region opposed to the gate electrode, a low-resistance region having a lower electric resistance than the channel region, and an intermediate region between the low-resistance region and the channel region, wherein the intermediate region has a dimension of no less than 1 µm nor more than 3 µm in a channel length direction; and
    a conductive film provided selectively in contact with the low-resistance region of the semiconductor film, wherein the conductive film is between the substrate and the semiconductor film, and the gate electrode does not overlap the conductive film in a plan view.

2. The semiconductor device according to claim 1, further comprising:
    a gate insulating film between the gate electrode and the semiconductor film, wherein
    the gate electrode, the gate insulating film, and the semiconductor film are provided in this order over the substrate.

3. The semiconductor device according to claim 1, further comprising a metal oxide film that is in contact with at least the intermediate region of the semiconductor film.

4. The semiconductor device according to claim 1, wherein the conductive film includes an oxide.

5. The semiconductor device according to claim 4, wherein
    the semiconductor film includes a metal, and
    the conductive film includes the metal that is same as the metal included in the semiconductor film.

6. The semiconductor device according to claim 1, further comprising:
    a gate insulating film between the gate electrode and the semiconductor film, wherein
    the semiconductor film, the gate insulating film, and the gate electrode are provided in this order over the substrate.

7. The semiconductor device according to claim 6, wherein the gate electrode and the gate insulating film have an identical planar shape.

8. The semiconductor device according to claim 1, further comprising:
    a contact electrode electrically connected to the low-resistance region, wherein the semiconductor film is between the conductive film and the contact electrode.

9. The semiconductor device according to claim 8, wherein the contact electrode directly contacts the semiconductor film, and the conductive film directly contacts the semiconductor film.

10. A semiconductor device comprising:
    a substrate;
    a gate electrode over the substrate;
    a semiconductor film including an oxide semiconductor material, the semiconductor film including a channel region opposed to the gate electrode, a low-resistance region having a lower electric resistance than the channel region, and an intermediate region provided between the low-resistance region and the channel region and having a carrier concentration satisfying the following Expression 1:

$$C1 < C2 < C3 \qquad \text{Expression 1}$$

where
    $C1$ denotes the carrier concentration in the channel region of the semiconductor film,
    $C2$ denotes the carrier concentration in the intermediate region of the semiconductor film, and
    $C3$ denotes the carrier concentration in the low-resistance region of the semiconductor film; and
    a conductive auxiliary film provided selectively in contact with the low-resistance region of the semiconductor film, the conductive auxiliary film reducing a resistance of the semiconductor film, wherein the conductive auxiliary film is between the semiconductor film and the substrate, and the intermediate region is exposed by the gate electrode in a plan view.

11. The semiconductor device according to claim 10, wherein the conductive auxiliary film includes aluminum.

12. The semiconductor device according to claim 10, wherein the conductive auxiliary film include a hydrogen-containing film.

13. The semiconductor device according to claim 10, wherein the carrier concentration C2 in the intermediate region of the semiconductor film is no higher than $1.4 \times 10^{20}$ cm$^{-3}$.

14. The semiconductor device according to claim 10, further comprising:
 a gate insulating film between the gate electrode and the semiconductor film, wherein
 the semiconductor film, the gate insulating film, and the gate electrode are provided in this order over the substrate.

15. The semiconductor device according to claim 10, further comprising:
 a gate insulating film between the gate electrode and the semiconductor film, wherein
 the gate electrode, the gate insulating film, and the semiconductor film are provided in this order over the substrate.

16. The semiconductor device according to claim 10, further comprising:
 a contact electrode electrically connected to the low-resistance region, wherein the contact electrode directly contacts a first side of the semiconductor film, and the conductive auxiliary film directly contacts a second side of the semiconductor film opposite to the first side.

17. A display apparatus comprising a display element and a semiconductor device that drives the display element, the semiconductor device including:
 a gate electrode;
 a semiconductor film including an oxide semiconductor material, the semiconductor film including a channel region opposed to the gate electrode, a low-resistance region having a lower electric resistance than the channel region, and an intermediate region provided between the low-resistance region and the channel region and having a carrier concentration satisfying the following Expression 1:

$$C1<C2<C3 \qquad \text{Expression 1}$$

where
 C1 denotes the carrier concentration in the channel region of the semiconductor film,
 C2 denotes the carrier concentration in the intermediate region of the semiconductor film, and
 C3 denotes the carrier concentration in the low-resistance region of the semiconductor film;
 a conductive auxiliary film provided selectively in contact with the low-resistance region of the semiconductor film, the conductive auxiliary film reducing a resistance of the semiconductor film; and
 a contact electrode electrically connected to the low-resistance region through the conductive auxiliary film.

18. The display apparatus according to claim 17, wherein the contact electrode directly contacts the conductive auxiliary film.

19. The display apparatus according to claim 18, wherein the conductive auxiliary film directly contacts the semiconductor film.

* * * * *